US009524787B2

(12) United States Patent
Maejima

(10) Patent No.: US 9,524,787 B2
(45) Date of Patent: Dec. 20, 2016

(54) SEMICONDUCTOR MEMORY DEVICE

(71) Applicant: KABUSHIKI KAISHA TOSHIBA, Tokyo (JP)

(72) Inventor: Hiroshi Maejima, Setagaya Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/061,960

(22) Filed: Mar. 4, 2016

(65) Prior Publication Data

US 2016/0276034 A1 Sep. 22, 2016

(30) Foreign Application Priority Data

Mar. 16, 2015 (JP) ................ 2015-051637

(51) Int. Cl.
| | |
|---|---|
| G11C 5/14 | (2006.01) |
| G11C 16/26 | (2006.01) |
| G11C 16/10 | (2006.01) |
| G11C 16/08 | (2006.01) |
| G11C 16/04 | (2006.01) |
| G06F 11/10 | (2006.01) |
| G11C 29/52 | (2006.01) |

(52) U.S. Cl.
CPC .......... *G11C 16/26* (2013.01); *G06F 11/1068* (2013.01); *G11C 16/0483* (2013.01); *G11C 16/08* (2013.01); *G11C 16/10* (2013.01); *G11C 29/52* (2013.01); *G11C 5/14* (2013.01)

(58) Field of Classification Search
CPC .......... G11C 16/24; G11C 16/10; G11C 16/26
USPC ........................ 365/185.25, 185.17, 189.09
See application file for complete search history.

(56) References Cited

U.S. PATENT DOCUMENTS

| | | | |
|---|---|---|---|
| 6,125,052 A | 9/2000 | Tanaka | |
| 7,920,421 B2 | 4/2011 | Maejima et al. | |
| 8,542,533 B2 | 9/2013 | Maejima et al. | |
| 8,952,426 B2 | 2/2015 | Maejima | |
| 2004/0080980 A1* | 4/2004 | Lee ................ | G11C 11/5628 365/185.17 |
| 2007/0064495 A1* | 3/2007 | Shibata ................ | G11C 8/08 365/185.28 |
| 2009/0161433 A1 | 6/2009 | Lee et al. | |
| 2012/0155186 A1 | 6/2012 | Chokan et al. | |
| 2013/0265829 A1 | 10/2013 | Suzuki | |
| 2015/0115350 A1 | 4/2015 | Maejima | |

FOREIGN PATENT DOCUMENTS

JP 2012-227889 A 11/2012

* cited by examiner

*Primary Examiner* — Jason Lappas
(74) *Attorney, Agent, or Firm* — Patterson & Sheridan, LLP

(57) ABSTRACT

A semiconductor memory device includes memory cells, word lines that are electrically connected to gates of the memory cells, a source line that is electrically connected to one end of the memory cells, and a controller that executes a read operation over first, second, third, and fourth time periods. A first voltage is applied to a selected word line during the first and second time periods of the first operation, and a second voltage that is higher than the first voltage is applied to the selected word line during the third and fourth time periods of the second operation. A third voltage is applied to the source line during the first and third time periods, and fourth and fifth voltages that are lower than the third voltage are applied to the source line during the second and fourth time periods, respectively.

20 Claims, 18 Drawing Sheets

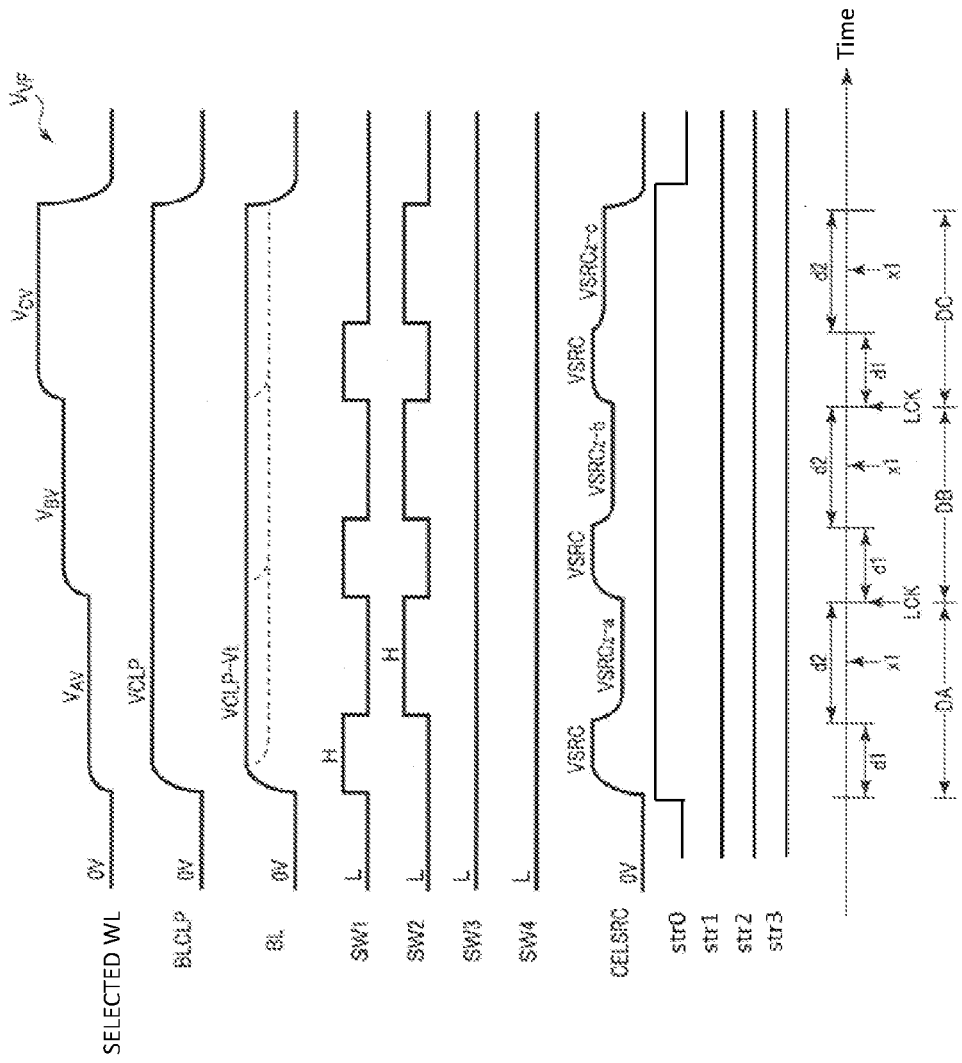

SEMICONDUCTOR MEMORY DEVICE

CROSS-REFERENCE TO RELATED APPLICATION

This application is based upon and claims the benefit of priority from Japanese Patent Application No. 2015-051637, filed Mar. 16, 2015, the entire contents of which are incorporated herein by reference.

FIELD

Embodiments described herein relate generally to a semiconductor memory device.

BACKGROUND

A NAND type flash memory in which memory cells are arranged three-dimensionally is known.

DESCRIPTION OF THE DRAWINGS

FIG. 10A and FIG. 10B are timing diagrams illustrating the operation example of the semiconductor memory according to the first embodiment during a program verification.

DETAILED DESCRIPTION

Figure 1:
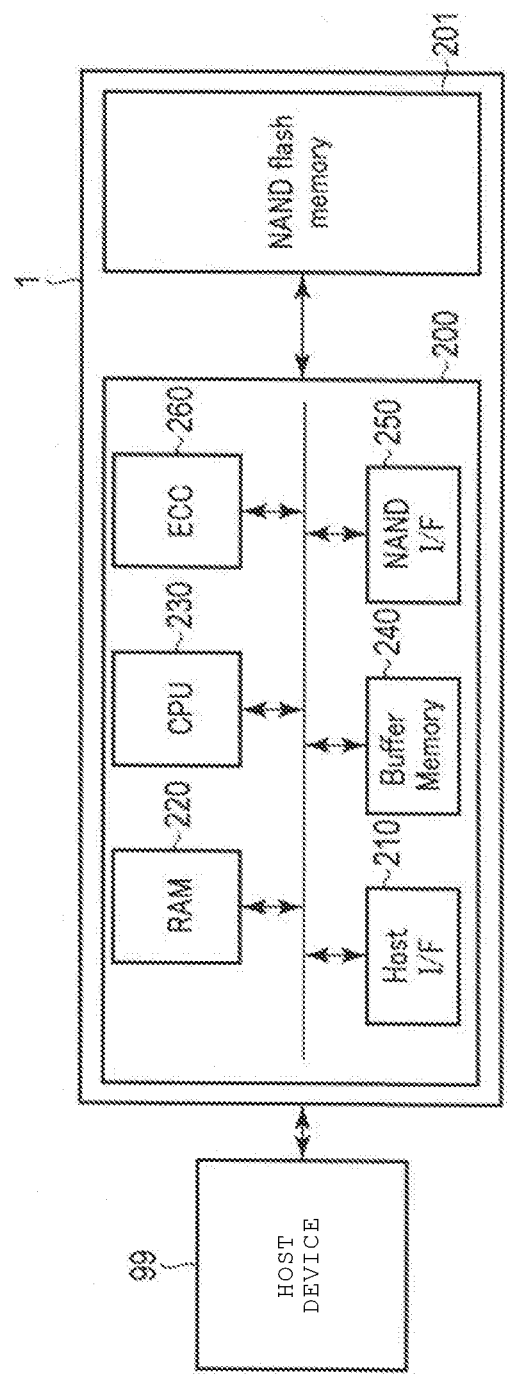
FIG. 1 is a block diagram illustrating a memory system that includes a semiconductor memory according to an embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, when the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, when the structure in one of the figures is turned over, elements described as "below" or "beneath" other elements would then be oriented "above"

the other elements. The exemplary terms "below" or "beneath" may, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiments provide a semiconductor memory device which increases operational characteristics of a semiconductor memory.

In general, according to one embodiment, a semiconductor memory device includes a plurality of memory cells that are stacked above a substrate, a plurality of word lines that are electrically connected to gates of the memory cells, a source line that is electrically connected to one end of the memory cells, and a controller configured to execute a read operation that includes a first operation carried out over first and second time periods and a second operation carried out over third and fourth time periods. A first voltage is applied to a selected word line during the first and second time periods of the first operation, and a second voltage that is higher than the first voltage is applied to the selected word line during the third and fourth time periods of the second operation. A third voltage is applied to the source line during the first and third time periods, whereas a fourth voltage that is lower than the third voltage is applied to the source line during the second time period, and a fifth voltage that is lower than the third voltage is applied to the source line during the fourth time period.

Hereinafter, the present embodiments will be described in detail with reference to the drawings. In the following description, the same symbols or reference numerals will be attached to the elements having the same functions and configurations.

In the following respective embodiments, when the reference numerals (for example, a word line WL, a bit line BL, various voltages and signals, or the like) are accompanied by numbers or alphabetical characters for differentiation, such numbers or alphabetical characters may be omitted when differentiation is not needed in the description.

EMBODIMENTS

A semiconductor memory device according to the embodiments will be described with reference to FIG. 1 to FIG. 18.

(1) First Embodiment

A semiconductor memory (semiconductor memory device) according to a first embodiment will be described with reference to FIG. 1 to FIG. 13.

(a) Configuration Example

A configuration example of the semiconductor memory according to the first embodiment will be described with reference to FIG. 1 to FIG. 8.

As illustrated in FIG. 1, a memory system includes a storage device 1 and a host device 99.

The host device 99 requests writing/erasing of data, and reading of data to the storage device 1.

The storage device 1 is coupled to the host device 99. The storage device 1 and the host device 99 perform data transfer with each other through, for example, a connector, wireless communication, the Internet, or the like.

The storage device 1 includes a memory controller 200 and a semiconductor memory 201.

The memory controller 200 includes a host interface circuit 210, an embedded memory (e.g., RAM) 220, a processor (e.g., CPU) 230, a buffer memory 240 (e.g., RAM), a memory interface circuit 250, and an ECC circuit 260.

The host interface circuit 210 couples the memory controller 200 to the host device 99. The host interface circuit 210 controls communication with the host device 99. Thus, the host interface circuit 210 transmits requests and data received from the host device 99 to the CPU 230 and the buffer memory 240. The host interface circuit 210 transmits data stored in the buffer memory 240 to the host device 99, in response to a command of the CPU 230.

The memory interface circuit 250 is connected to the semiconductor memory 201 via a bus. The memory interface circuit 250 controls communication with the semiconductor memory 201. The memory interface circuit 250 transmits a command from the CPU 230 to the semiconductor memory 201. When writing data to the semiconductor memory 201, the memory interface circuit 250 transmits the data stored in the buffer memory 240 to the semiconductor memory 201. When reading data from the semiconductor memory 201, the memory interface circuit 250 transmits the data read from the semiconductor memory 201 to the buffer memory 240.

The CPU 230 controls the entire operation of the memory controller 200. For example, when receiving a writing request from the host device 99, the CPU 230 issues a write command based on an interface standard. When reading and erasing as well as writing, the CPU 230 issues a command according to the request of the host device 99. The CPU 230 performs various processing for managing the semiconductor memory 201, for example, wear leveling or the like. The CPU 230 performs various arithmetic functions, such as encryption processing of data or randomizing of data.

The ECC circuit 260 performs error checking and correcting (ECC) processing of data. When writing data, the ECC circuit 260 generates parity based on the data to be written. When reading data, the ECC circuit 260 detects error by generating syndrome from the parity. The ECC circuit 260 corrects the detected error. Alternatively, the CPU 230 may perform the function of the ECC circuit 260.

The embedded memory 220 is a semiconductor memory such as a DRAM, and is used as a work memory (work area) of the CPU 230. The embedded memory 220 retains a firmware for managing the semiconductor memory 201, various management tables, or the like. The CPU 230 controls an operation of the semiconductor memory 201 with reference to information stored in the management tables.

The semiconductor memory 201 is a memory device that includes one or more memory chips embedded in a package. The semiconductor memory 201 is, for example, a NAND type flash memory. The storage device 1 (or memory system) including a flash memory is, for example, a memory card (for example, SD™ card), a USB memory, a solid state drive (SSD), or the like.

Figure 2:
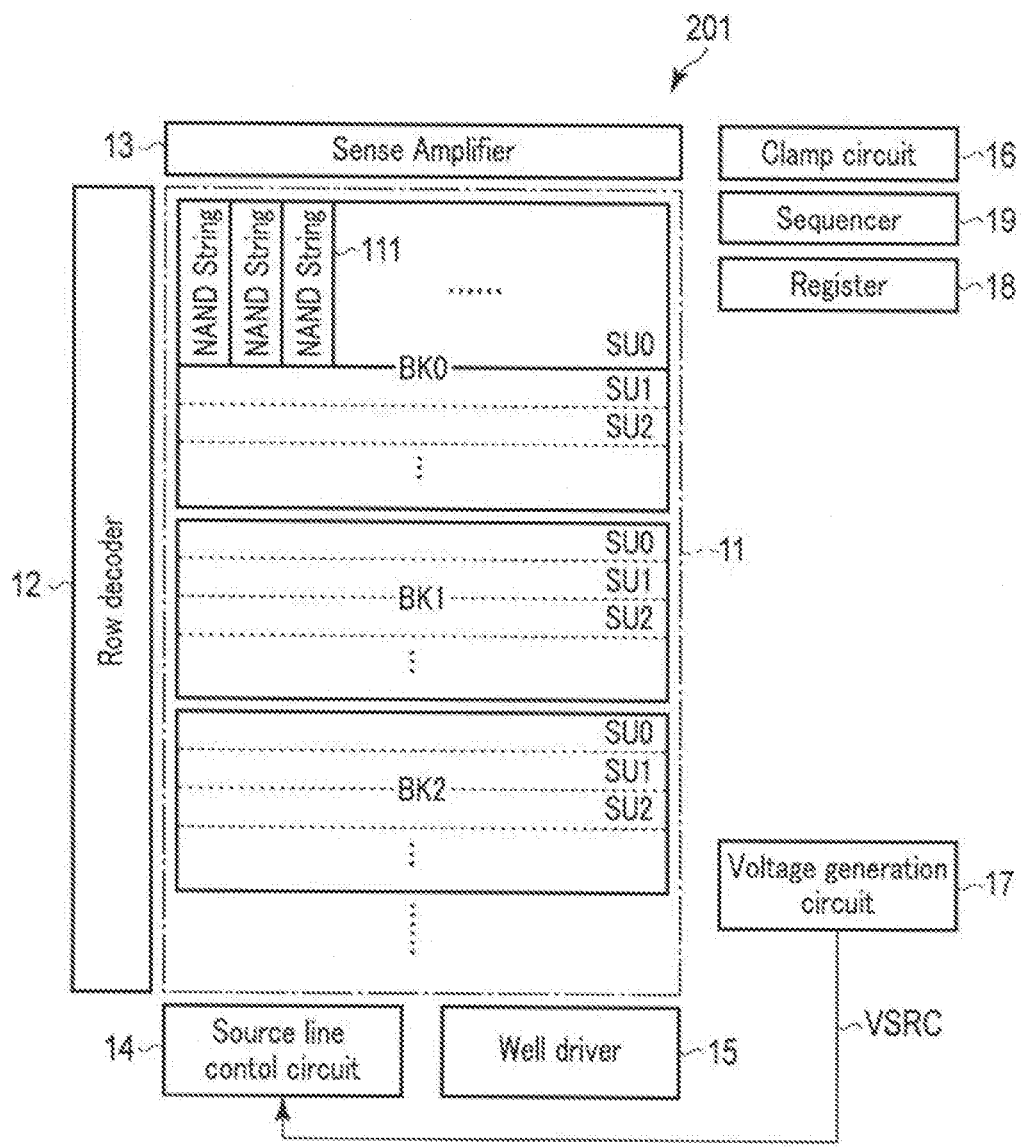
FIG. 2 is a block diagram illustrating an example of an internal configuration of the semiconductor memory.

As illustrated in FIG. 2, the flash memory 201 includes a memory cell array 11, and a plurality of circuits (hereinafter referred to as a peripheral circuit) that controls an operation of the memory cell array 11.

For example, the NAND type flash memory 201 includes the memory cell array 11, a row decoder 12, a sense amplifier circuit 13, a source line control circuit 14, a well driver 15, a clamp circuit 16, a voltage generation circuit 17, a register 18, and a sequencer 19.

The memory cell array 11 includes a plurality of blocks BK (BK0, BK1, BK2, . . . ). A single block BK is, for example, a unit of data erasure. An erase operation according to the present embodiment is performed on a per block basis, but not limited to this. In alternative embodiments, the erase operation may be performed on a per unit basis smaller than the block BLK. Such an erasing method is described in, for example, U.S. patent application Ser. No. 13/235,389, filed Sep. 18, 2011 and entitled "NON-VOLATILE SEMICONDUCTOR MEMORY DEVICE," and U.S. patent application Ser. No. 12/694,690, filed Jan. 27, 2010 and entitled "NON-VOLATILE SEMICONDUCTOR STORAGE DEVICE." The entire contents of these patent applications are incorporated by reference in the present specification.

Each block BK includes a plurality (for example, four) of string units SU (SU0, SU1, SU2, . . . ). The plurality of string units (may be referred to as sub-blocks) SU each include a plurality of NAND strings (memory cell units) 111. Each NAND string 111 includes a plurality of memory cells that are connected in series to each other. The number of blocks included in the memory cell array 11, the number of string units included in one block BK, or the number of memory cells included in the NAND strings is arbitrary.

The row decoder 12 decodes a block address and a page address, and selects one word line of a block corresponding to the address. The row decoder 12 applies voltages for operating the flash memory 201 to a selected word line and non-selected word lines.

The sense amplifier circuit 13 senses and amplifies a signal that is output from the memory cell to a bit line, when reading data. The sensed and amplified signal is treated as the data that is stored in the memory cell. In addition, the sense amplifier circuit 13 transmits a signal corresponding to the data (hereinafter may be referred to as write data) to be written to the memory cells, when writing data.

The clamp circuit 16 controls a potential of a bit line by controlling transistors included in the sense amplifier circuit 13.

The source line control circuit 14 applies a voltage to a source line, and controls a potential of the source line.

The well driver 15 applies a voltage to a well region in which the NAND string 111 is provided.

The voltage generation circuit 17 generates various voltages that are applied to various conductive lines included in the flash memory 201.

The register 18 retains various signals. The register 18 retains, for example, a status of a write operation or an erase operation of the data. According to this, the flash memory 201 notifies the controller 200 of whether or not the operation is normally completed. The register 18 retains a command, an address, or the like that is received from the controller 200. The register 18 also retains various tables (management information).

The sequencer 19 controls the entire operation of the flash memory 201. The sequencer 19 controls the operation inside the flash memory 201, based on control signals and commands which are transferred between the memory controller 200 and the flash memory 201.

Figure 3:
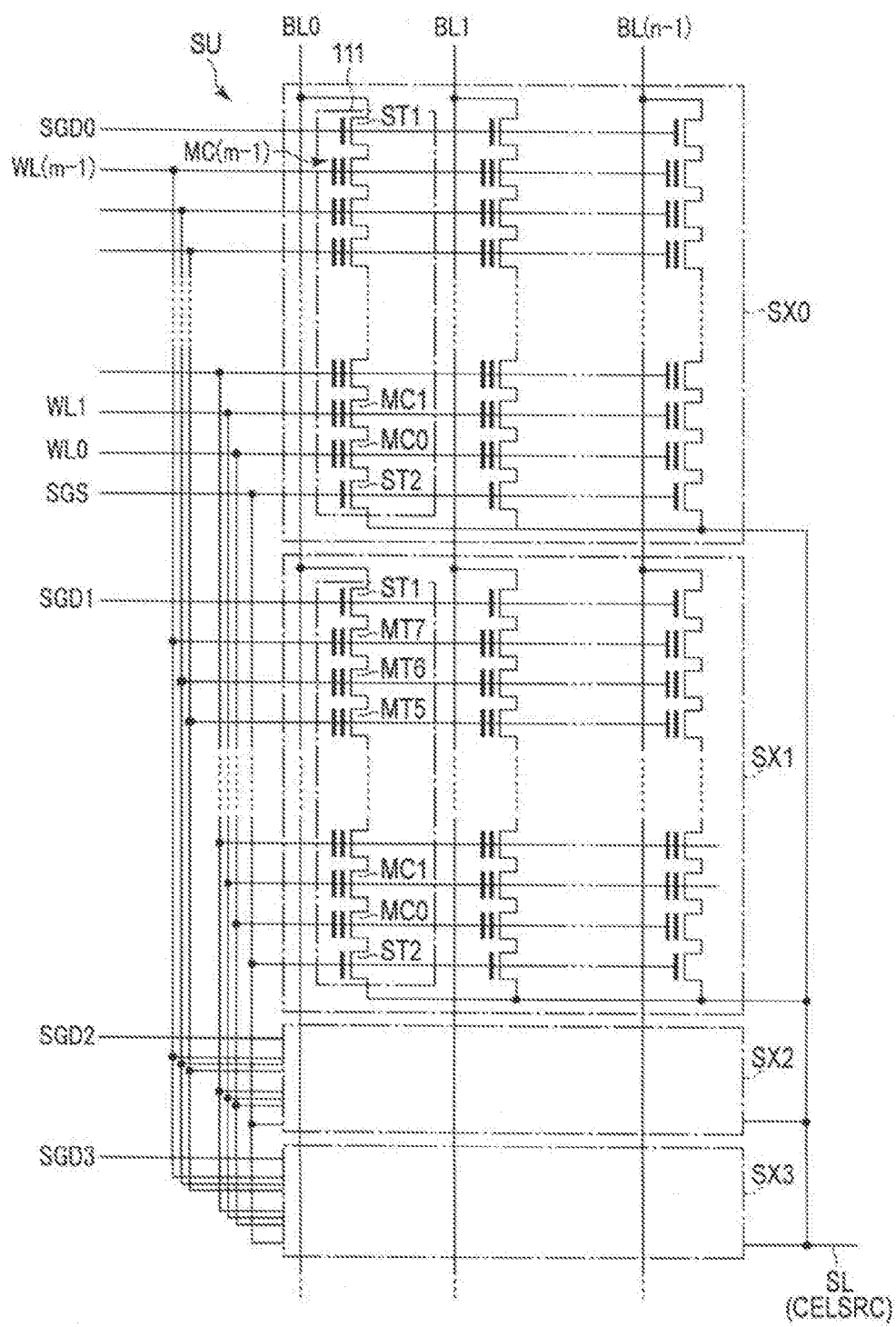
FIG. 3 is a diagram illustrating an example of an internal configuration of a memory cell array of the semiconductor memory.

As illustrated in FIG. 3, the string unit SU includes four string groups SX (SX0 to SX3). Each string group SX includes a plurality of NAND strings 111.

The NAND string 111 includes a plurality of memory cells MC (MC0 to MC(m−1)), and select transistors ST1 and ST2. Meanwhile, (m−1) is a natural number equal to or greater than "1".

The memory cell (memory cell transistor) MC includes a control gate and a charge accumulation layer (memory film). In the NAND string 111, the plurality of memory cells MC are connected in series to each other between the select transistors ST1 and ST2. One terminal (source or drain) of the memory cell MC(m−1) among the plurality of memory cells that are connected in series to each other, is connected to one terminal (source or drain) of the select transistor ST1. One terminal (source or drain) of the memory cell MC0 is connected to one terminal of the select transistor ST2.

A plurality of select gate lines SGD0 to SGD3 are respectively connected to gates of the select transistors ST1 of a plurality of string groups SX0 to SX3.

One select gate line SGS is connected in common to gates of the select transistors ST2, across the plurality of string groups SX.

The word lines WL0 to WL (m−1) are each connected in common to control gates of all the memory cells MC having the same numbers as the word line in the same block BK.

The word lines WL0 to WL(m−1) and the select gate line SGS are connected in common across the plurality of string groups SX0 to SX3 included in the same string unit SU. Select gate lines SGD, on the other hand, are independently provided for each of the string groups SX0 to SX3, even within the same string unit SU.

In the memory cell array 11, the other terminals (sources or drains) of the select transistors ST1 of the NAND string 111 of the same column, among the NAND strings 111 arranged in a matrix form, are connected in common to one bit line BL (BL0 to BL(n−1)) of a plurality of bit lines. The bit line BL is connected in common to multiple NAND strings 111, across the plurality of blocks BK. Meanwhile, (n−1) is a natural number equal to or greater than 1.

The other terminal (source or drain) of the select transistor ST2 is connected to the source line SL.

The reading and writing of the data is collectively performed with respect to the plurality of memory cells MC which is connected in common to any one of the word lines WL of a selected string group, in any one of the string units SU of any one of the blocks BK. The unit of the reading and writing data is referred to as a page PG.

Figure 4:
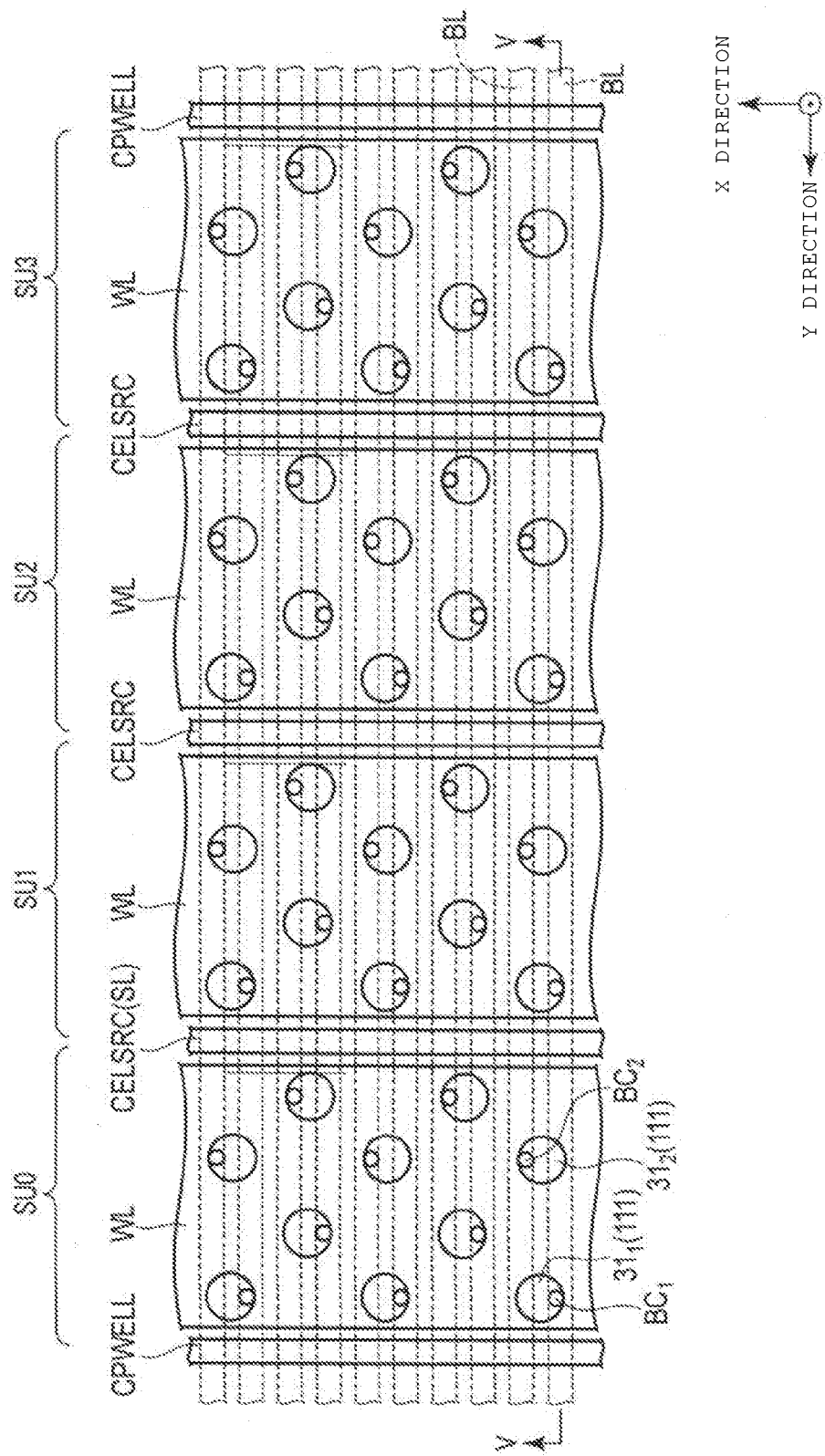
FIG. 4 is a plan view illustrating an example of a structure of the memory cell array of the semiconductor memory.

As illustrated in an upper view of the memory cell array (block) of FIG. 4, a well contact CPWELL is provided at opposite ends of the block BK in the X direction, in the block BK. For example, the block BK is provided in a region that is surrounded by the well contact CPWELL.

A source line contact CELSRC is provided between the string units SU.

The plurality of the NAND strings 111 includes semiconductor pillars 31 ($31_1$, $31_2$). The semiconductor pillars 31 are arranged in the X direction and Y direction on a substrate (semiconductor region). Bit line contacts BC ($BC_1$, $BC_2$) are provided on the semiconductor pillars 31. The bit line contacts BC are connected to the bit lines BL.

Two NAND strings 111 adjacent to each other in the Y direction are connected to different bit lines BL. In this case, the bit line contacts $BC_1$ and $BC_2$ are not aligned with each other in the Y direction. In the plurality of NAND strings 111 aligned in the Y direction, the positions of the bit line contacts $BC_1$ and $BC_2$ are alternately shifted in the X direction. In addition, plurality of NAND strings 111 aligned in an oblique direction (crossing both the X and Y directions) is connected to the bit lines BL different from each other.

Figure 5:
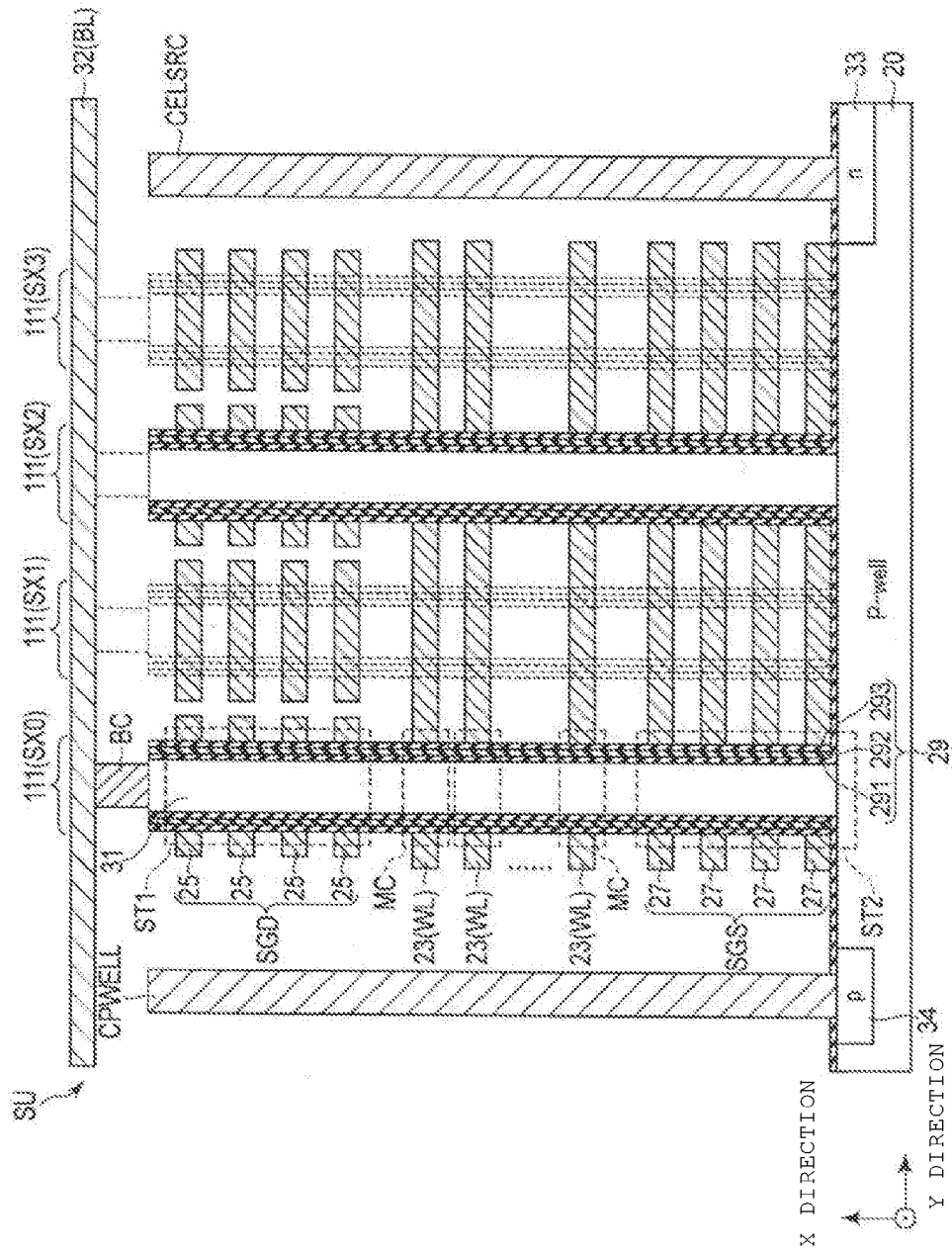
FIG. 5 is a sectional view illustrating the example of the structure of the memory cell array of the semiconductor memory.

FIG. 5 illustrates a sectional structure taken along V-V line of FIG. 4. In FIG. 5, a member that is positioned in a depth direction (direction perpendicular to a paper surface), is denoted by a dotted line. In FIG. 5, one string unit SU is extracted and illustrated.

As illustrated in FIG. 5, in the sectional structure of the memory cell array 11, a p type well region 20 is provided in a semiconductor region (for example, Si substrate).

The semiconductor pillars 31 are provided on the p type well region 20. The semiconductor pillars 31 are extended in a direction approximately perpendicular to a surface of the p type well region 20 (substrate). A current flows through the semiconductor pillars 31. The semiconductor pillars 31 are regions in which channels of each transistor are formed, when the memory cells MC and the select transistors ST1 and ST2 operate.

A memory film 29 is provided on a side surface of the semiconductor pillar 31. The memory film 29 includes a gate insulating film 291, a charge accumulation layer (insulating film) 292, and a block insulating film 293, which are sequentially overlaid in that order on a side of the semiconductor pillar 31.

A plurality of conductive layers 23, 25, and 27 are stacked on the well region 20. An interlayer insulating film (not illustrated) is provided between the conductive layers 23, 25, and 27. The respective conductive layers (word lines) 23, 25, and 27 are provided on a side surface of the semiconductor pillar 31, via the memory film 29.

A plurality (four, in the present example) of conductive layers 25 are connected to the select gate line SGD on the same drain side, in each of the NAND strings 111.

A plurality (four, in the present example) of conductive layers 27 are connected to the select gate line SGS on the same source side.

The bit line contact BC is provided on an upper end of the semiconductor pillar 31. A conductive layer (bit line) 32 is provided on the bit line contact.

An $n^+$ type diffusion layer 33 and a $p^+$ type diffusion layer 34 are provided in a surface region of the well region 20.

A source line contact CELSRC is provided on the diffusion layer 33. The source line contact CELSRC is connected to a source line SL. The source line SL is connected to the source line control circuit 14. The gate insulating film 291 covers a surface of the well region 20. The conductive layer 27 and the gate insulating film 291 are extended up to the edge of the diffusion layer 33. According to this, when the select transistor ST2 is turned on, the channel of the select transistor ST2 electrically connects the memory cell MC to the diffusion layer 33.

Meanwhile, one source line SL may be provided in one block BK, or a plurality of source lines SL may be provided in one block BK. When the plurality of source lines SL are provided in one block BK, one source line is provided for each control unit (for example, string unit SU) in the block BK.

A well contact PWELL is provided on a diffusion layer 34. The well contact CPWELL is connected to a well wire (not illustrated). The well wire is connected to a well driver 15. By applying a voltage to the well contact CPWELL, a voltage may be applied to the well region 20 and the semiconductor pillars 31.

Meanwhile, the structure, operation, and fabrication method of a memory cell array with a three-dimensional structure in alternative embodiments may be as described in, for example, U.S. patent application Ser. No. 12/407,403, filed Mar. 19, 2009 and entitled "THREE-DIMENSIONALLY STACKED NON-VOLATILE SEMICONDUCTOR MEMORY," U.S. patent application Ser. No. 12/406,524, filed Mar. 18, 2009 and entitled "THREE-DIMENSIONALLY STACKED NON-VOLATILE SEMICONDUCTOR STORAGE DEVICE," U.S. patent application Ser. No. 12/679,991, filed Mar. 25, 2010 and entitled "NON-VOLATILE SEMICONDUCTOR MEMORY DEVICE AND FABRICATION METHOD THEREOF," and U.S. patent application Ser. No. 12/532,030, filed Mar. 23, 2009 and entitled "SEMICONDUCTOR MEMORY AND FABRICATION METHOD THEREOF." The entire contents of these patent applications are incorporated by reference herein.

Figure 6:
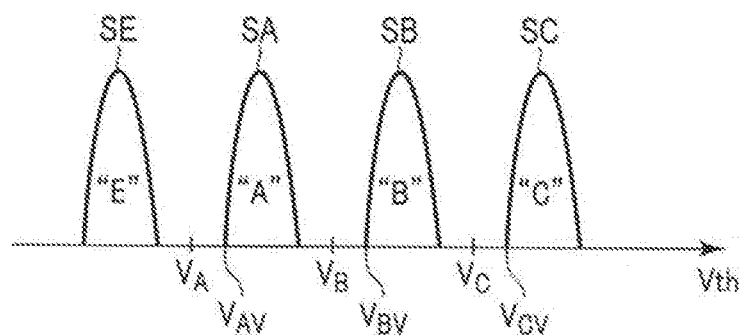
FIG. 6 is a diagram illustrating a relationship between data and a threshold voltage of a memory cell.

As illustrated in FIG. 6, in the flash memory 201, a threshold voltage of, for example, the memory cell MC belongs to any one of four threshold voltage distributions (erased state SE and programmed state SA, SB, and SC), in accordance with the data to be stored.

A determination level (reading level) at which threshold voltage states (threshold voltage distributions) adjacent to each other are determined, is each of voltage values $V_A$, $V_B$, and $V_C$.

When reading the data, the sequencer 19 applies a voltage including each of reading levels $V_A$, $V_B$, and $V_C$ to the selected word line. According to this, the memory cell in a threshold value state equal to or lower than the reading level is turned on, and the memory cell in a threshold value state higher than the reading level is turned off. Based on the result of ON and OFF of the memory cell MC, the data stored in the memory cell MC is determined.

In a writing sequence of the flash memory, the sequencer 19 performs one or more writing loops. The writing loop includes a program step and a verification step.

In the program step, the sequencer 19 applies a program voltage to the selected word line. The threshold voltage of the memory cell MC is shifted to the positive side.

The sequencer 19 performs the verification step (program verification), after the program voltage is applied once.

The sequencer 19 applies each of verification levels $V_{AV}$, $V_{BV}$, and $V_{CV}$ to the selected word line, and verifies the result of the program step. The sequencer 19 determines whether the memory cell is in a program-completed state (passed the verification) or in a program-uncompleted state (failed the verification), in accordance with ON or OFF of the memory cell MC.

By repeating the program step and the verification step, the threshold voltage of the memory cell is shifted up to a target threshold voltage.

Meanwhile, the memory cell acquires a threshold voltage of two values (one bit data), eight values (four bit data), or 16 values (eight bit data), according to characteristics or a type of the flash memory.

At the time of reading the data and in the verification step, a cell current $I_{cell}$ flows through the NAND string 111 that includes the memory cell targeted for reading, if that memory cell is in an ON state. For example, the cell current $I_{cell}$ flows from the bit line BL toward the source line SL. A current $I_{total}$ which is the total of the cell current $I_{cell}$ becomes a current flowing through the source line SL. There is also a case in which a small leakage current flows through the NAND string 111 targeted for reading, even if that memory cell in an OFF state and the leakage current is included in the current $I_{total}$ flowing through the source line SL.

When the current $I_{total}$ is large, a potential of the source line SL may be increased to a value greater than a set value to be controlled.

A distance between a certain NAND string 111 and the source line CELSRC is different from a distance between other NAND string 111 and the source line CELSRC. According to FIG. 5, a distance between a NAND string 111 (SX0) and the source line CELSRC is longer than that between a NAND string 111 (SX2) and the source line CELSRC, for example. Therefore a parasitic resistance of the NAND string 111 (SX0) is different from that of the NAND string 111 (SX2).

Accordingly, the flash memory 201 (sequencer 19) of the present embodiment monitors the current $I_{total}$ in the inside of the chip to compensate a difference of the parasitic resistance. The flash memory 201 controls the potential of the source line SL, based on the monitoring result.

The sequencer 19 determines a voltage to be applied to the source line SL (CELSRC), based on the monitoring result of the current $I_{total}$ and a magnitude of the resistance components of the NAND string 111, when the threshold voltage of the memory cell MC is sensed. According to this, the sequencer 19 compensates for an increased amount of the potential of the source line SL which is generated by the current $I_{total}$.

For example, the flash memory 201 offsets the increased amount of the potential of the source line SL which is generated by the current $I_{total}$, by decreasing a potential (voltage value) that is applied to the source line SL by the source line control circuit 14 to a value smaller than the set value.

For example, according to the source line control circuit 14 having the following circuit configuration, the flash memory 201 according to the present embodiment monitors the magnitude of the current $I_{total}$, and controls the potential of the source line SL.

(b) Configuration Example of Source Line Control Circuit

The source line control circuit 14 of the flash memory according to the present embodiment will be described with reference to FIG. 7 and FIG. 8.

First, a connection relationship between the source line control circuit 14 and other circuits will be described.

Figure 7:
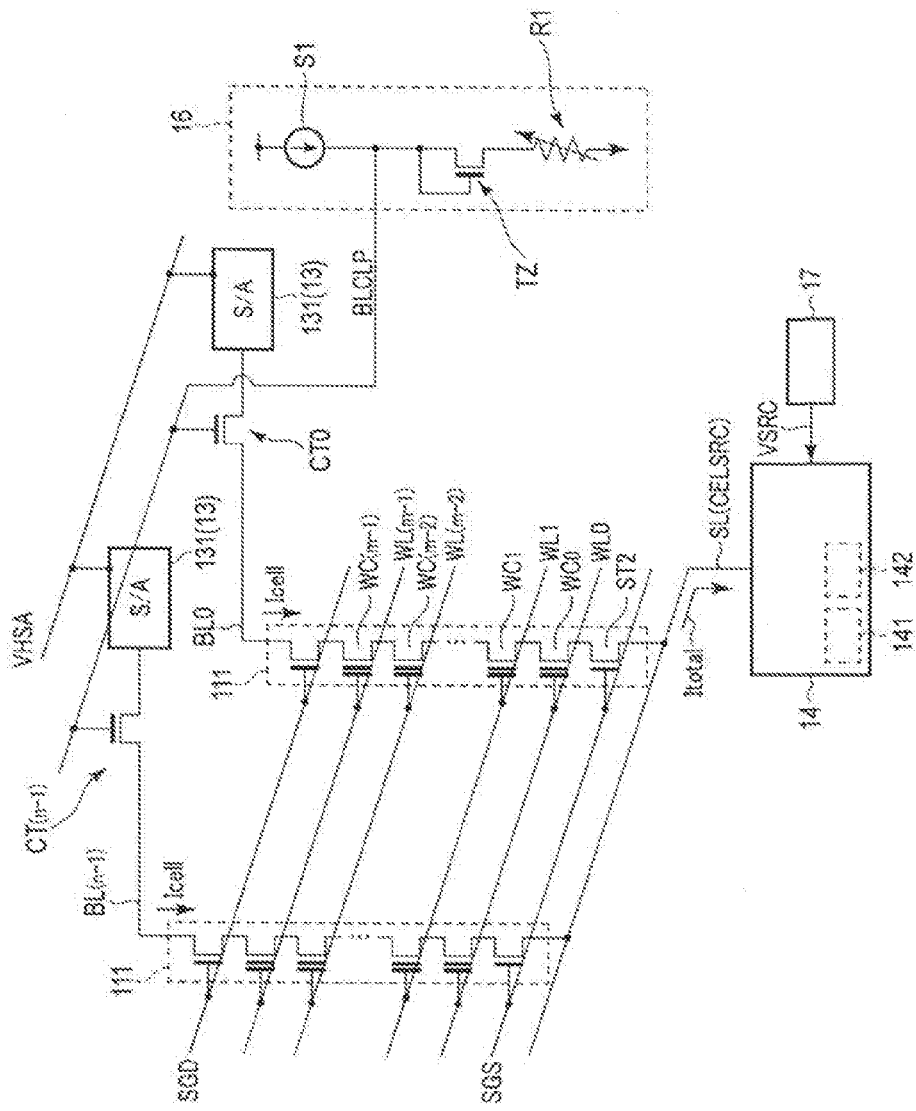
FIG. 7 is a diagram illustrating a configuration example of the semiconductor memory according to a first embodiment.

As illustrated in FIG. 7, a sense amplifier circuit 13 includes a sense unit 131 and a transistor CT.

Each bit line BL is connected to one sense unit 131 via the transistors CT (CT0 to CT (n−1)).

A plurality of sense units 131 is connected in common to a voltage line (hereinafter referred to as voltage line VHSA) to which a voltage VHSA is applied. The voltage VHSA is supplied to the sense unit 131.

The transistor CT controls a potential of the bit line BL. Hereinafter, the transistor CT is referred to as a clamp transistor CT. Gates of a plurality of clamp transistors are connected to a clamp circuit 16 via a common wire BLCLP.

The clamp circuit 16 controls the clamp transistor CT by controlling a potential of the wire BLCLP.

The clamp circuit 16 includes a current source S1, a transistor TZ, and a resistor element R1.

One terminal (input terminal) of the current source S1 is connected to a terminal (hereinafter referred to as a voltage terminal VDD) to which a power supply voltage VDD is applied. The other terminal (output terminal) of the current source S1 is connected to the wire BLCLP.

One terminal of the transistor TZ (for example, n channel type field effect transistor) is connected to the wire BLCLP, and is connected to the other terminal of the current source S1. The other terminal of the transistor TZ is connected to one terminal of the resistor element R1. A gate of the transistor TZ is connected to one terminal of the transistor TZ. The transistor TZ is thus configured as a diode.

The other terminal of the resistor element R1 is connected to a terminal (hereinafter referred to as a ground terminal Vss) to which a ground voltage Vss is applied.

The clamp circuit 16 controls a potential of the wire BLCLP, based on a voltage between terminals of the resistor element R1.

For example, in the present embodiment, all the bit lines BL in the block are controlled in common. In the present embodiment, at the time of reading the data and at the time of the verification step, potentials of all bit lines BL in the string unit SU are controlled in common by the clamp circuit 16.

The source line control circuit 14 is connected to the source line SL. The source line control circuit 14 controls the potential of the source line SL, based on a certain voltage value. The source line control circuit 14 includes a circuit (function) for monitoring the current $I_{total}$.

In the flash memory according to the present embodiment, the source line control circuit 14 includes a regulator circuit (voltage control circuit) 141, and a replica circuit (resistor replication circuit) 142.

Figure 8:
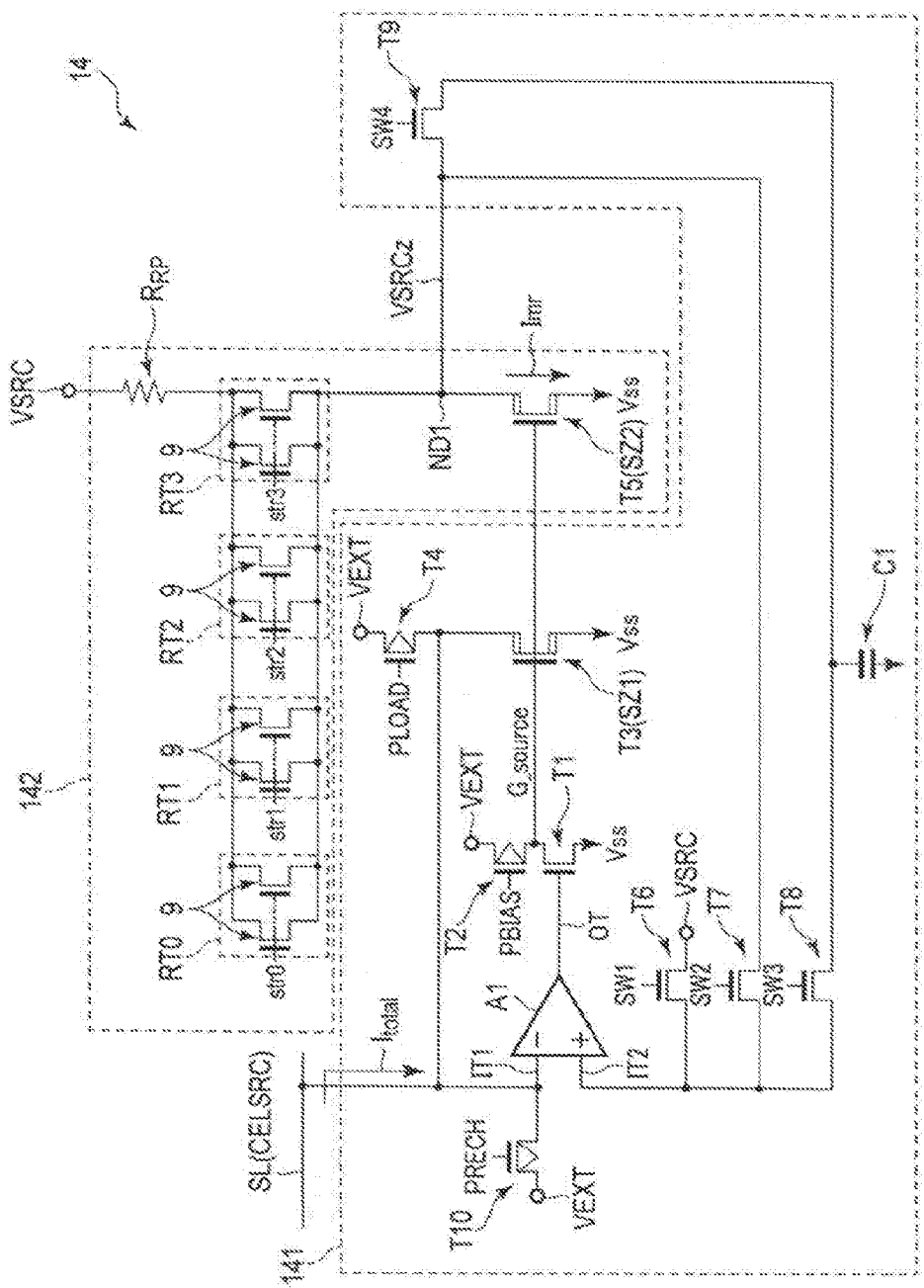
FIG. 8 is a diagram illustrating a configuration example of a source line control circuit of the semiconductor memory according to the first embodiment.

As illustrated in FIG. 8, the regulator circuit 141 is connected to the source line SL. The regulator circuit 141 controls a potential (hereinafter, may be referred to as a source line voltage) which is applied to the source line SL.

The regulator circuit 141 includes an amplifier (for example, differential amplifier) A1 and a plurality of transistors T1 to T9.

A first input terminal (inverting input terminal) IT1 of the amplifier A1 is connected to the source line SL. A second input terminal (non-inverting input terminal) IT2 of the amplifier A1 is connected to a plurality of transistors T6, T7, and T8. An output terminal OT of the amplifier A1 is connected to the transistor T1.

The amplifier A1 outputs comparison results of a signal (voltage) that is supplied to the input terminals IT1 and IT2, through a third terminal (output terminal) OT as an output signal.

A gate of the transistor (for example, n type field effect transistor) T1 is connected to the output terminal OT of the amplifier A1. One terminal of the transistor T1 is connected to a wire G_source. One terminal of the transistor T1 is connected to a terminal (hereinafter referred to as a voltage terminal VEXT) to which an external voltage VEXT is applied, via the transistor T2. The other terminal of the transistor T1 is connected to the ground terminal Vss.

The wire G_source is connected to one terminal of the transistor T1 and one terminal of the transistor T2.

A gate of the transistor (for example, p type field effect transistor) T2 receives a control signal PBIAS. ON and OFF states of the transistor T2 are controlled by the control signal PBIAS. The transistor T2 that is in an ON state supplies the voltage VEXT to the wire G_source.

The transistor T1 is driven by an output signal from the amplifier A1. The transistor T1 outputs a drain current according to a magnitude of the output signal. A magnitude of the drain current of the transistor T1 is changed depending on the magnitude of the output signal of the amplifier A1. As a result, the transistor T1 controls the potential of the wire G_source.

A gate of the transistor T3 is connected to the wire G_source. One terminal of the transistor T3 is connected to the terminal IT1 of the amplifier A1. The one terminal of the transistor T3 is connected to the voltage terminal VEXT, via the transistor T4. For example, the transistor T3 is an n type field effect transistor (n type high-voltage transistor) with a high breakdown voltage.

Agate of the transistor (for example, p type field effect transistor) T4 receives a control signal PLOAD. ON and OFF states of the transistor T4 are controlled by the control signal PLOAD. The transistor T4 that is in an ON state supplies a voltage VEXT to one end of a current path of the transistor T4.

The source line SL is connected to a junction of the transistor T3 and the transistor T4.

The transistor T3 outputs a drain current according to a potential of the wire G_source. A magnitude of the drain current of the transistor T3 is changed depending on the potential of the wire G_source. As the result, the voltage of the source line SL is controlled.

A transistor T10 is an element that controls precharging of the input terminal IT1 of the amplifier A1 and the source line SL. One terminal of a transistor T10 is connected to the input terminal IT1. The other terminal of the transistor T10 is connected to the voltage terminal VEXT. A gate of the transistor T10 receives a control signal PRECH. ON and OFF states of the transistor T10 are controlled by the control signal PRECH. According to this, each wire connected to the transistor T10 is precharged.

The replica circuit 142 replicates a parasitic resistance included in the memory cell array 11.

The replica circuit 142 is connected to the regulator circuit 141 via the transistors T7, T8, and T9.

The replica circuit 142 includes a resistor element $R_{RP}$. Hereinafter, the resistor element $R_{RP}$ is referred to as a replica resistor element $R_{RP}$.

One terminal of the replica resistor element $R_{RP}$ is connected to a terminal (hereinafter referred to as a voltage terminal VSRC) to which the voltage VSRC is applied. The voltage VSRC is applied to one terminal of the replica resistor element $R_{RP}$.

The replica resistor element $R_{RP}$ has a resistance value corresponding to a resistance component included in the NAND string 111. For example, a resistance value of the replica resistor element $R_{RP}$ corresponds to a total of various resistance values, such as a resistance value of a metal wire such as a bit line, a resistance value of a via plug (for example, via line contact), a resistance value of a semiconductor region (for example, the semiconductor pillar and the well region), and a resistance value of a source contact. The resistance value of the replica resistor element $R_{RP}$ is set, based on the results that are obtained from experimental results related to the flash memory, or estimated values that are determined from physical properties of each material.

Furthermore, the NAND string 111 includes an ON resistance of the select transistor ST2 on the source side, as a parasitic resistance.

The replica circuit 142 includes a plurality of transistors RT (RT0, RT1, RT2, RT3), in order to replicate the parasitic resistance caused by the select transistor ST2 on the source side. Hereinafter, the transistor RT is referred to as a replica transistor.

The replica transistors RT are connected in parallel with one another.

One terminal of the replica transistor RT is connected to the other terminal of the replica resistor element $R_{RP}$, and the other terminal of the replica transistor RT is connected to one terminal of a transistor T7 and a transistor T9.

Gates of the replica transistors RT0 to RT3 receive controls signals str (str0 to str3) different from one another. The replica transistors RT are turned on or off by the control signals str.

Meanwhile, a NAND string (string group SX3) positioned in the vicinity of the source line contact CELSRC (source line SL), and a NAND string (string group SX0) positioned far from the source line SL, exist in the string unit SU (refer to FIG. 4 and FIG. 5).

In the plurality of the NAND strings 111, a magnitude of the ON resistance (parasitic resistance) of the select transistor ST2 on the source side is changed depending on a position of the NAND string 111 with respect to the source line contact CELSRC.

When the select transistor ST2 on the source side is turned on, the NAND string 111 is connected to the source line contact CELSRC via a channel that is formed in the semiconductor region 20. A resistance value of the semiconductor region 20 between the select transistor ST2 on the source side and the source line contact CELSRC becomes a resistance component included in the NAND string.

A magnitude of a resistance is increased in proportion to a length of a semiconductor region. Hence, as the length of the semiconductor region between the select transistor ST2 and the source line contact CELSRC is lengthened, a resistance value that is included in the semiconductor region between the select transistor ST2 and the source line contact CELSRC is increased.

For example, an ON resistance of the select transistor ST2 in the NAND string of the string group SX0 is larger than an ON resistance of the select transistor ST2 in the NAND string of the string group SX3.

Thus, the ON resistance of the select transistor ST2 on the source side is changed depending on the position of the NAND string that is selected with respect to the source line contact CELSRC.

For example, the replica transistor RT includes a plurality of transistors 9 that are connected in parallel with each other. The numbers of the transistors 9 included in the replica transistor RT are set differently in each of the replica transistors RT, in such a manner that the ON resistances of the select transistors ST2 on the source side which are different from one another may be replicated, in each string group SX.

The source line control circuit 14 sets the replica transistor RT to an ON state in response to the control signal str, so as to correspond to a position (address of the select gate line SGD on the drain side) of the NAND string that is selected for writing or reading the data.

In this way, with using the replica transistor RT corresponding to the selected string, a difference of the ON resistance (parasitic resistance) of the select transistor on the source side in each NAND string is compensated.

Furthermore, the replica transistor RT is provided on a substrate, in the same manner as the select transistor ST2 on the source side. Hence, the replica transistor RT may compensate for a change of the ON resistance of the select transistor ST2 which is generated by a change of an operational temperature.

Meanwhile, only one resistor element $R_{RP}$ is illustrated in FIG. 8. However, the replica circuit 142 may include a plurality of resistor elements having resistance values different from each other. According to tested results of the flash memory, an element having a resistance value appropriate for controlling a source line voltage is selected from among a plurality of resistor elements. In addition, by connecting two or more resistor elements in parallel with each other or in series to each other, a replica resistor element $R_{RP}$ with a certain resistance value may be provided.

A transistor T5 functions as an element (monitoring transistor) for monitoring the current $I_{total}$ flowing through the source line, in the replica circuit 142. For example, the transistor T5 is an n type field effect transistor (high-voltage transistor) with a high insulating voltage (breakdown voltage).

One terminal of the transistor T5 is connected to the voltage terminal VSRC via the replica resistor element $R_{RP}$ and the replica transistor RT. The other terminal of the transistor T5 is connected to the ground terminal Vss. A junction (node) of the transistor T5 and the replica transistor RT becomes an output node ND1 of the replica circuit 142.

Meanwhile, one terminal of the transistor T5 is connected to transistors T7 and T9 via the output node ND1.

A gate of the transistor T5 is connected to the wire G_source.

The transistor T5 is driven by a gate voltage, in common with the transistor T3. An output current (drain current) Imr of the transistor T5 is a mirror current of an output current (drain current) of the transistor T3.

A gate size (for example, gate width) SZ2 of the transistor T5 is smaller than a gate size (for example, gate width) SZ1 of the transistor T3. For example, the gate size SZ2 of the transistor T5 is approximately one hundredth of the gate size SZ1 of the transistor T3. An output current of the transistor T5 becomes smaller than an output current of the transistor T3, according to a gate size ratio between the transistor T3 and the transistor T5. As the result, the replica circuit 142 may reduce a resistance value of a parasitic resistor which is replicated, according to the gate size ratio between the transistors T3 and T5. Thus, sizes of the resistor element $R_{RP}$ and the replica transistor RT may be reduced.

As the transistor T5 operates, a current flows through the replica circuit 142. According to this current, a voltage is decreased by the resistor element $R_{RP}$ and the replica transistor RT.

The replica circuit 142 outputs a voltage VSRCz to which influence of the parasitic resistance (replica resistance of the NAND string) of the memory cell array 11 is reflected).

In this way, a magnitude of the output voltage VSRCz of the replica circuit 142 is controlled by the transistor T5. The output voltage VSRCz is a voltage that is applied to the source line SL, when the voltage of the bit line BL is sensed at the time of determining the threshold voltage of the memory cell MC.

Hereinafter, the replica resistor element $R_{RP}$ and the replica transistor RT are referred to as a replica element.

Alternatively, the replica circuit 142 may have the same structure (dummy string) as the NAND string, without using the replica resistor element and the replica transistor.

The transistors (for example, n type field effect transistors) T6, T7, T8, and T9 are elements for selecting a signal (voltage) that is supplied to the input terminal IT2 of the amplifier A1. As any one of the transistors T6, T7, and T8 is in an ON state, a signal (voltage) that is supplied to the input terminal of the amplifier A1 may be selected.

A gate of the transistor T6 receives a control signal SW1. ON and OFF states of the transistor T6 are controlled by the control signal SW1.

When turned on, the transistor T6 supplies the voltage VSRC from the voltage generation circuit 17 to the terminal IT2 of the amplifier A1. The voltage VSRC is, for example, approximately 0.8 V.

A gate of the transistor T7 receives a control signal SW2. ON and OFF states of the transistor T7 are controlled by the control signal SW2. The transistor T7 is connected between a terminal IT2 of the amplifier A1 and the output node ND1.

When turned on, the transistor T7 supplies the output voltage VSRCz from the replica circuit 142 to the output terminal IT2 of the amplifier A1.

A gate of the transistor T8 receives a control signal SW3. ON and OFF states of the transistor T8 are controlled by the control signal SW3.

When turned on, the transistor T8 supplies a voltage retained in a capacitor C1 to the terminal IT2 of the amplifier A1.

One terminal of the transistor T9 is connected to the one terminal of the transistor T5 and the other terminal of the transistor T7. A junction of the other terminal of the transistor T9 and the other terminal of transistor T8 is connected to one terminal of the capacitor C1. The other terminal of the capacitor C1 is grounded. A gate of the transistor T9 receives a control signal SW4. ON and OFF states of the transistor T9 are controlled by the control signal SW4. The capacitor C1 retains the output signal VSRC of the replica circuit 142 via the transistor T9 that is in an ON state.

The regulator circuit 141 operates, in such a manner that a voltage which is applied to the source line SL becomes approximately the voltages VSRC and VSRCz which are supplied to the input terminal IT2 of the amplifier A1.

In the flash memory according to the present embodiment, according to the following operation, the source line control circuit 14 controls the source line voltage using voltages that are supplied from each of the transistors T6, T7, and T8, based on the monitoring result of a current flowing through the source line.

(c) Operation Example

An operation example (method of controlling a semiconductor memory and a memory controller) of a memory system including a semiconductor memory according to the present embodiment will be described with reference to FIG. 9 and FIG. 10A and FIG. 10B. FIG. 10A is an example which the control signal str0 is selected. So the control signal str0 is "H" level during the verification stages DA, DB, and DC. Other control signals are "L" level during these verification stages. Otherwise, FIG. 10B is an example which the control signal str1 is selected. The control signal str1 is "H" level during the verification stages DA, DB, and DC. We mainly use FIG. 10A as a following explanation.

Here, FIG. 1 to FIG. 8 will also be used as references. Meanwhile, a potential of the wire CELSRC of FIG. 10A and FIG. 10B indicates a voltage which is applied to the source line (source line contact) by the source line control circuit 14.

Determination of a threshold voltage of the memory cell MC is performed in the verification step in a writing sequence, or at the time of reading data in a reading sequence.

Hereinafter, a method of controlling a potential of the source line of the flash memory according to the present embodiment will be described with using the verification step (verification operation) of a multi-value flash memory (here, flash memory of four values) as an example.

Figure 9:
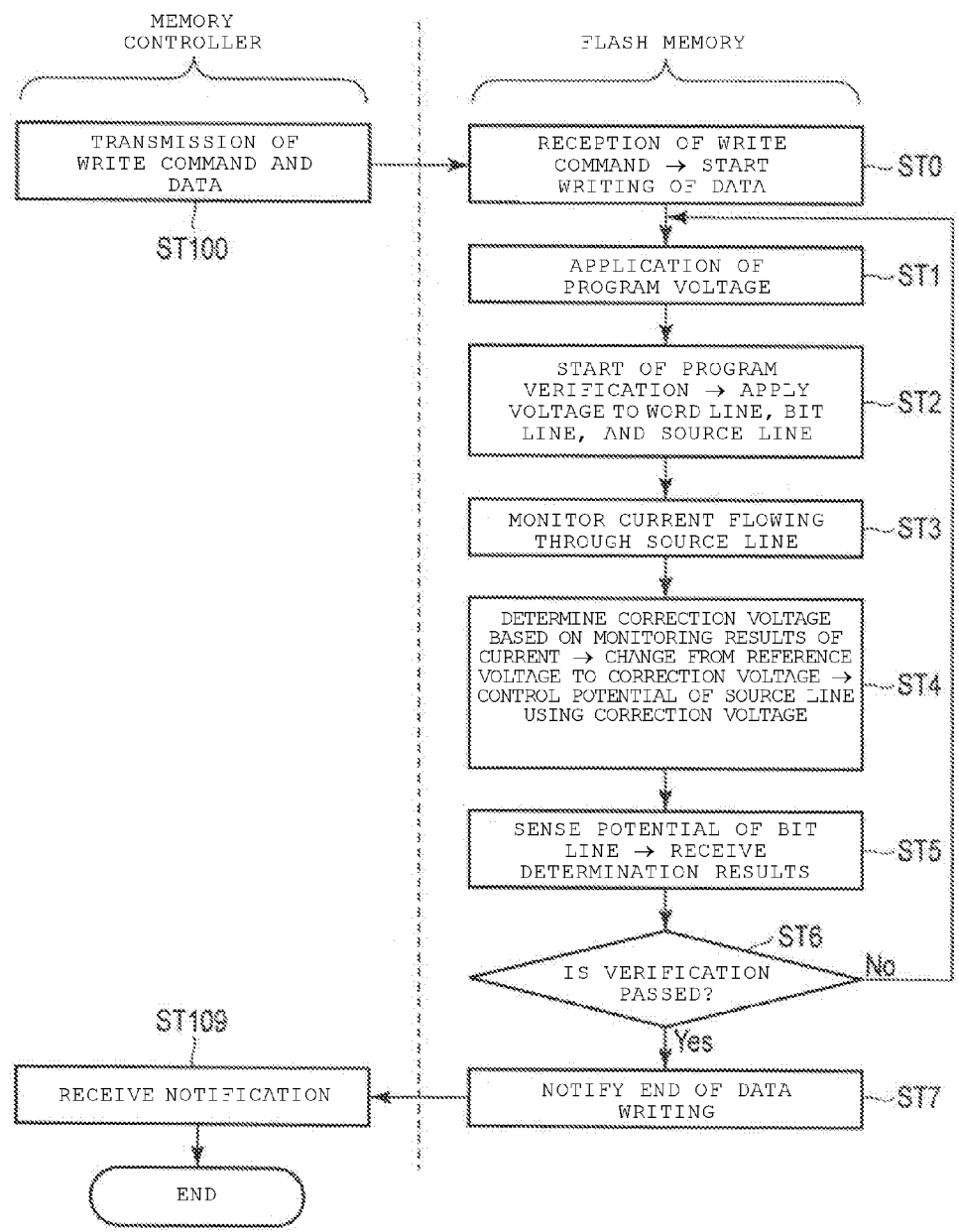
FIG. 9 is a flowchart illustrating an operation example of the semiconductor memory according to the first embodiment.
Figure 10B:
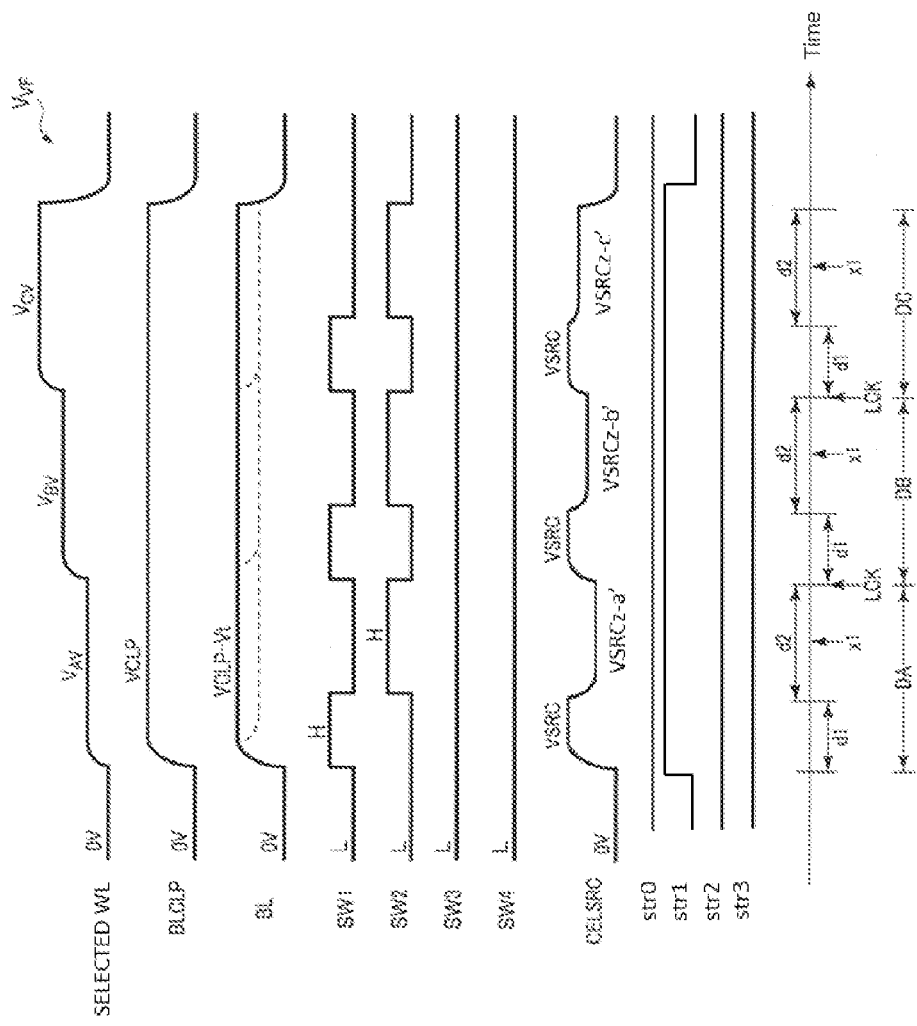

As illustrated in a flowchart of FIG. 9, at the time of writing the data, the memory controller 200 transmits a write command, an address for data writing, and data from the host device 99 to the flash memory 201 (step ST100).

The flash memory 201 receives a command from the memory controller 200 (step ST0). The sequencer 19 in the flash memory 201 interprets the command, and starts an operation sequence, based on the command.

When the command is a write command, the sequencer 19 executes a program step (step ST1). The sequencer 19 applies a program voltage to a selected word line that is indicated by an address.

After the program voltage is applied, the sequencer 19 starts determination (verification step) of the threshold voltage of the memory cell MC, i.e., whether the threshold voltage has reached a certain determination level, as illustrated in a timing chart (diagram illustrating potentials of each wire and a change of the control signal) of FIG. 10A (step ST2).

The voltage generation circuit 17 generates various voltages (for example, the voltage VSRC and the voltage VHSA), according to the control of the sequencer 19. The well driver 15 applies a voltage to the well region 20 via the well wire and well contact CPWELL.

The voltage VHSA is applied to the sense unit 131 of the sense amplifier circuit 13.

In addition, the clamp circuit 16 controls the voltage of the wire BLCLP, and applies the voltage VCLP to the gate of the clamp transistor CT. According to this, the sense amplifier circuit 13 applies the voltage VCLP-Vt to the plurality of bit lines (for example, all the bit lines) BL in the selected string unit SU, using the clamp transistor CT. Vt is a threshold voltage of a clamp transistor.

The row decoder 12 selects the block BK, the string unit SU, the string group, and the page PG that are indicated by the address.

The source line control circuit 14 applies various voltages to the source line SL and each wire (terminal) in the source line control circuit 14.

For example, the source line control circuit 14 sets the control signal PRECH to an L level, and precharges the source line SL and the input terminal IT1 of the amplifier A1, according to the control of the sequencer 19. After precharging, the source line control circuit 14 sets the control signal PRECH to an H level. Thereafter, the source line control circuit 14 sets the control signal PBIAS and the control signal PLOAD as an L level, and applies the voltage VEXT to each wire.

According to this, the source line control circuit 14 enters a state in which the control of the source line voltage CELSRC and the monitoring of the current $I_{total}$ may be started. The source line control circuit 14 applies the voltage VSRC to the source line SL, as an initial state of verification.

The row decoder 12 applies the non-select voltage Vread to the non-selected word lines, and applies the verification voltage $V_{VF}$ to the selected word line. In the memory cell of four values, for example, the verification voltage $V_{VF}$ includes three verification levels $V_{AV}$, $V_{BV}$, and $V_{CV}$. According to this, the sequencer 19 performs verification of each state in a sequence of A state, B state, and C state.

The sequencer 19 sets the voltage value of the verification voltage $U_{VF}$ to the verification level $V_{AV}$, and performs program verification related to the A state. By applying the verification level $V_{AV}$, the memory cell MC is turned on or off according to the threshold voltage of the memory cell MC.

During a verification period (hereinafter, the verification period is referred to as a verification stage) of an A state, the memory cell MC with a threshold voltage equal to or lower than the verification level $V_{AV}$ is turned on, and the memory cell with a threshold voltage higher than the verification level $V_{AV}$ is turned off. The memory cell that is turned on by the verification level $V_{AV}$ is a memory cell that has failed verification with regard to the A state. The memory cell that is turned off by the verification level $V_{AV}$ is a memory cell that has passed verification with regard to the A state.

The cell current $I_{cell}$ flows through the NAND string 111 that includes the memory cell that is the verification target.

The cell current $I_{cell}$ is supplied to the source line SL. A current (and a leakage current) which is the total of the cell current $I_{cell}$ flows through the source line SL as the current $I_{total}$.

In the present embodiment, during a first period (hereinafter referred to as a monitoring period) d1 after verification starts, the source line control circuit 14 monitors a magnitude of the current $I_{total}$ of the voltage VSRC, in parallel to the program verification (step ST3).

The source line control circuit 14 (or the sequencer 19) sets the control signal SW1 to an H level, during the monitoring period d1. In addition, during the monitoring period d1, the source line control circuit 14 sets the control signals SW2, SW3, and SE4 to an L level.

According to this, the transistor T6 is turned on, and supplies the voltage VSRC to the terminal IT2 of the amplifier A1.

In the regulator circuit 141, the amplifier A1 performs a differential amplification (comparison) of the potential of the source line SL supplied to the terminal IT1 and the voltage VSRC supplied to the terminal IT2. The amplifier A1 outputs a signal (for example, signal of an L level or an H level) which is obtained by performing a differential amplification, to the gate of the transistor T1 from the output terminal OT.

For example, when a potential (potential of the source line) which is applied to the input terminal IT1 is higher than the voltage VSRC which is applied to the input terminal IT2, the amplifier A1 outputs a signal of an L level. The transistor T1 is turned off by the signal of an L level from the amplifier A1. The potential of the wire G_source is maintained in a charged state, and is set to approximately the voltage VEXT.

The transistor T3 operates in accordance with the potential of the wire G_source in a charged state. As the result, the current $I_{total}$ flows into the ground terminal Vss by the transistor T3.

In this way, when the potential of the source line SL is higher than the reference voltage VSRC, the source line control circuit 14 increases a current amount that is output from the source line SL, and decreases the potential of the source line SL.

For example, when the potential of the source line SL that is applied to the input terminal IT1 is equal to or lower than the voltage VSRC that is applied to the input terminal IT2, the amplifier A1 outputs a signal of an H level (or a signal of a certain potential between an L level and an H level).

The transistor T1 is turned on by a signal of an H level from the amplifier A1. According to this, the wire G_source is discharged, and the potential of the wire G_source is decreased to a voltage lower than the voltage VEXT by the discharging.

The transistor T3 operates according to the potential of the wire G_source. When the potential of the wire G_source is lower than the voltage VEXT, the drain current of the transistor T3 is decreased to a current lower than the drain current of the transistor T3 when the voltage VEXT is applied to the gate of the transistor T3. Hence, in-take of the current $I_{total}$ performed by the transistor T3 is weak. As the result, the source line SL is discharged by a very small amount.

In this way, when the potential of the source line SL is equal to or lower than the reference voltage VSRC, the source line control circuit 14 decreases a current amount that is discharged from the source line SL, and increases the potential of the source line SL.

The operation of the regulator circuit 141 is repeated during the monitoring period d1, and thereby a voltage that is applied to the source line SL is controlled so as to become a certain value VSRC.

During the monitoring period d1, the transistor T5 controls a magnitude of the output voltage VSRCz of the replica circuit 142, in parallel with the control of the potential of the source line SL using the voltage VSRC which is performed by the amplifier A1. Hereinafter, the voltage VSRCz is referred to as a correction voltage VSRCz.

As described above, the gate of the transistor T5 is connected to the wire G_source. The transistor T5 is driven by a gate voltage having the same magnitude as that of the transistor T3. Hence, the transistor T5 outputs the mirror current Imr corresponding to the drain current of the transistor T3. A current flows through the replica elements $R_{RP}$ and RT, whereby voltage drop of the voltage VSRC occurs. According to this, the correction voltage VSRCz is generated in the node ND1.

During the monitoring period d1, a magnitude of the mirror current Imr is changed in conjunction with adjustment of the current $I_{total}$. According to this, a magnitude of a current flowing through the replica resistor element $R_{RP}$ and the replica transistor RT (replica element) is changed. As a result, a magnitude of the correction voltage VSRCz of the node ND1 is changed.

For example, when the mirror current Imr increases, the currents flowing through the replica elements $R_{RP}$ and RT increase. According to this, an amount of voltage drop caused by the replica elements $R_{RP}$ and RT is increased. As the result, the potential VSRCz of the output node ND1 decreases. When the mirror current Imr decreases, the currents flowing through the replica elements $R_{RP}$ and RT decrease. According to this, an amount of voltage drop caused by the replica elements $R_{RP}$ and RT is decreased. As the result, the potential VSRCz of the output node ND1 increases.

In the present embodiment, the replica transistor RT corresponding to a selected string group (NAND string), among the plurality of replica transistors RT0, is turned on by the control signal str. According to this, an ON resistance of the select transistor ST2 on the source side in which a gap (length of the semiconductor region between the source line contact CELSRC and the NAND string) between the source line contact CELSRC and the NAND string is taken into account, is reflected in an amount of drop of the correction voltage VSRCz of the replica circuit 142.

As described above, the source line control circuit 14 generates the voltage VSRCz that is adjusted based on the monitoring result of the current $I_{total}$ and the parasitic resistance of the memory cell array, using the replica circuit 142, under the control of the sequencer 19. According to this, a voltage in which a floating amount of the potential of the source line SL that is generated by the current $I_{total}$ is offset, is generated. For example, the correction voltage VSRCz is lower than the reference voltage VSRC (for example, 0.8 V).

As illustrated in FIG. 10A and FIG. 10B, after the monitoring period (adjusting period of the compensation voltage value) d1 of the current $I_{total}$ is completed, the source line control circuit 14 causes a signal level of the control signal SW1 to be transitioned from an H level to an L level. The source line control circuit 14 sets the control signal SW2 to an H level, in synchronization with a timing in which the control signal SW1 is set to an L level. The transistor T6 is turned off, and the transistor T7 is turned on. A voltage that is supplied to the input terminal IT2 of the amplifier A1 is switched to the correction voltage VSRCz from the reference voltage VSRC (step ST4).

During a sensing period d2, the transistor T7 is maintained in an ON state, and the transistor T7 supplies the correction voltage VSRCz to which a change of the current $I_{total}$ occurring in the sensing period d2 is reflected, to the amplifier A1. According to this, accuracy of the determination of the threshold voltage of the memory cell is increased.

Meanwhile, the potential of the well region 20 may change based on the monitoring results of the current $I_{total}$.

As illustrated in FIG. 9, FIG. 10A and FIG. 10B, during the sensing period d2 after the monitoring period d1, the regulator circuit 141 controls a magnitude of the source line voltage CELSRC, based on the comparison results of the correction voltage VSRCz and the potential of the source line SL (step ST3). According to this, the source line control circuit 14 controls the potential of the source line CELSRC, in such a manner that a voltage which is applied to the source line (source line contact) CELSRC becomes the voltage VSRCz (VSRCz<VSRC). For example, a total of the correction voltage VSRCz and a floating amount of the potential of the source line SL is approximately 0.8 V.

In a verification stage of the A state, the potential of the source line SL is controlled with using a correction voltage VSRCz-a, and thereby a gate-source voltage Vgs and a drain-source voltage Vds which are affected by a parasitic resistance, are compensated. In FIG. 10B, in a verification stage of the A state, the potential of the source line SL is controlled with using a correction voltage VSRCz-a', and thereby a gate-source voltage Vgs and a drain-source voltage Vds which are affected by a parasitic resistance, are compensated. The correction voltage VSRCz-a is different from the correction voltage VSRCz-a'. Simlarly, the correction voltage VSRCz-b is different from the correction voltage VSRCz-b'. The correction voltage VSRCz-c is different from the correction voltage VSRCz-c'.

At a time x1 of the sensing period d2, the sense unit 131 senses the potential of the bit line BL (step ST5). According to this, a latch circuit (not illustrated) in the sense amplifier circuit 13 receives the results of the verification of the A state.

After the verification of the A state, a verification stage DB of the B state and a verification stage DC of the C state are sequentially implemented.

In the present operation example, at the time of implementing (switching of verification level) of the verification stage, a control (first processing) of the potential of the bit line BL according to an ON or OFF state of the memory cell MC is performed.

For example, when the verification level is switched from the level $V_{AV}$ to the level $V_{BV}$, the sense amplifier circuit 13 sets the potential of the bit line BL to the same potential as the source line SL, without charging the bit line BL that is connected to the memory cell (memory cell that has passed verification with regard to the A state) in an OFF state. According to this, the bit line BL that is connected to the memory cell in an OFF state is in a non-selected state.

Hereinafter, an operation of setting the bit line to a non-selected state based on the determination results (for example, verification results) of the threshold voltage of the memory cell MC, is referred to as lock out processing LCK.

By the lock out processing LCK, the cell current $I_{cell}$ is hardly generated, in the NAND string that is connected to the bit line BL in a non-selected state.

In this way, since the cell current $I_{cell}$ from the bit line in which the lockout processing is completed is reduced, a current value of the current $I_{total}$ in which the lock out processing is completed is less than a current value of the current $I_{total}$ in which the lock out processing is not performed.

In the verification stages DB and DC of the B state and the C state, the source line control circuit 14 monitors the current $I_{total}$ during the motoring period d1, in substantially the same manner as the potential control of the source line SL in the verification stage DA of the A state (step ST2). The source line control circuit 14 controls the potential of the source line SL, based on the monitoring results during the sensing period d2 (step ST3). Thereafter, the potential of the bit line BL is sensed by the sense amplifier circuit 13 (step ST4).

When the lock out processing LCK is performed at the time of program verification, the verification level is increased, and thereby the current $I_{total}$ is reduced.

By the reduction of the current $I_{total}$, a floating amount of the potential of the source line SL at the time of verification of the C state is less than a floating amount of the potential of the source line SL at the time of verification of the A state.

In the present embodiment, the mirror current Imr of the transistor T5 decreases, and in contrast to this, the correction voltage VSRCz increases. In this way, the source line control circuit 14 compensates for a change of the floating amount of the potential of the source line SL due to the decrease of the current $I_{total}$.

Thus, as in the present embodiment, when the lock out processing LCK is performed, a correction voltage VSRCz-c at the time of verification of the C state is higher than a correction voltage VSRCz-a at the time of verification of the A state. In addition, a correction voltage VSRCz-b at the time of verification of the B state is equal to or higher than the correction voltage VSRCz-a, and is equal to or lower than the correction voltage VSRCz-c. As in the present embodiment, when the lock out processing LCK is performed in FIG. 10B, a correction voltage VSRCz-c' at the time of verification of the C state is higher than a correction voltage VSRCz-a' at the time of verification of the A state. In addition, a correction voltage VSRCz-b' at the time of verification of the B state is equal to or higher than the correction voltage VSRCz-a', and is equal to or lower than the correction voltage VSRCz-c'.

In this way, the source line control circuit 14 may apply a large potential in which the floating amount of the potential of the source line SL is taken into account, to the source line SL in each verification stage, in such a manner that the verification is performed in a state in which the potentials of the source lines SL are the same as each other, even when the verification level is changed.

As described above, the flash memory according to the present embodiment sequentially performs verification of the A state, the B state, and the C state, in the verification step.

The sequencer 19 determines whether or not the verification of all the cells selected as writing targets have passed (step ST6).

When the verification of all the select cells have not passed, the sequencer 19 repeats a writing loop (steps ST1 to ST6) including the program step and the verification step until writing of data to be stored in each memory cell is completed (until verification of all the memory cells have passed).

When the verification of all the selected cells have passed, the sequencer 19 completes the writing sequence. The sequencer 19 notifies the memory controller that the writing sequence is completed (step ST7).

The controller 200 receives notification of completion of the writing sequence from the flash memory 200 (step ST109). According to this, the controller 200 senses completion of the sequence of the flash memory corresponding to a command.

By the operation described above, operations of the flash memory and the memory system according to the present embodiment are completed.

Meanwhile, in the flash memory according to the present embodiment, the control of the potential of the source line based on the monitoring results of the current flowing through the source line SL described above, may be applied to a read operation of the flash memory.

Figure 11:
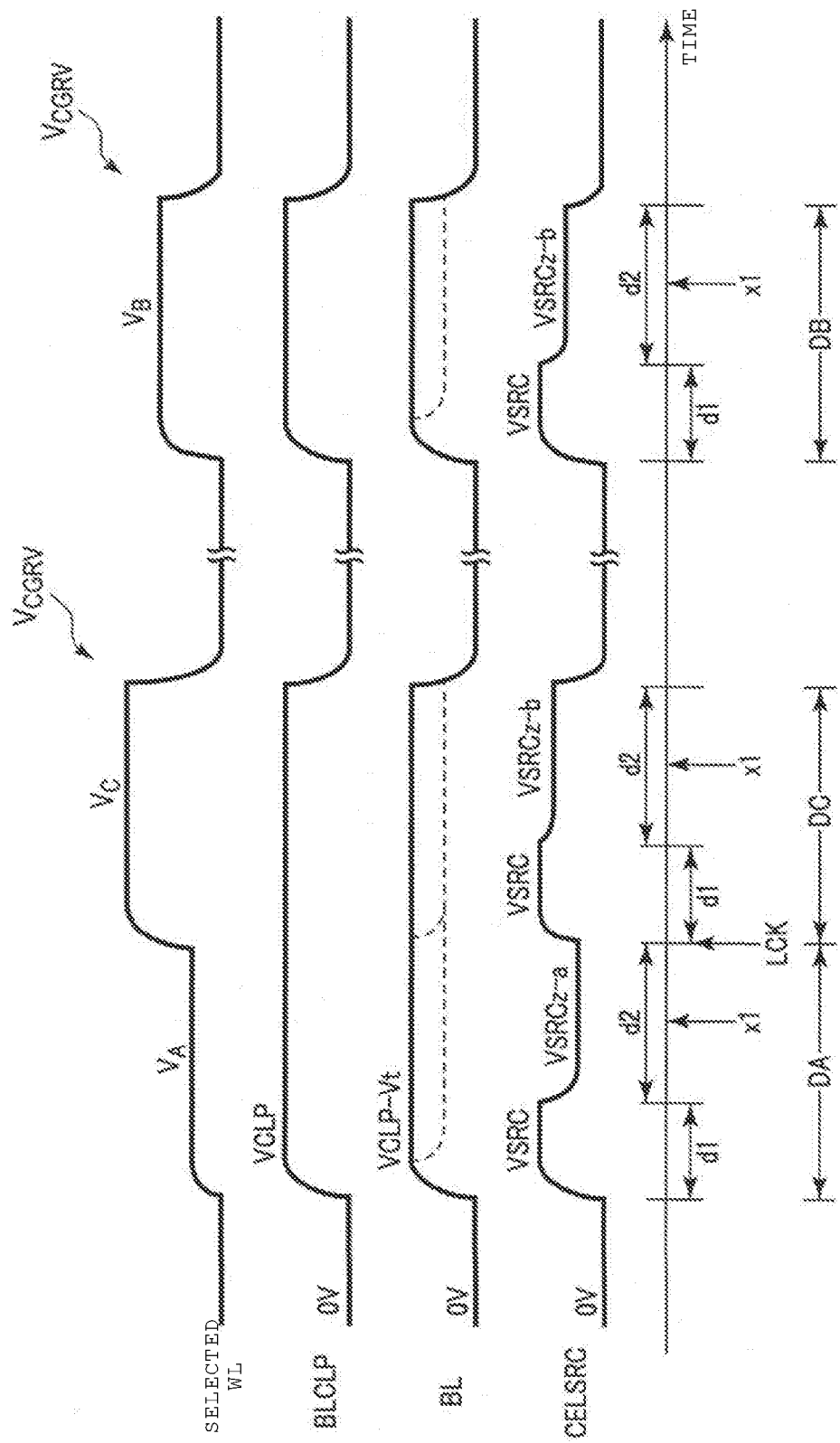
FIG. 11 is a timing diagram illustrating the operation example of the semiconductor memory according to the first embodiment during a data read.

As illustrated in FIG. 11, the control of the source line voltage at the time of data reading based on a read command from the memory controller 200, is substantially the same as the control of the source line voltage CELSRC at the time of verification, except that magnitudes of the reading levels $V_A$, $V_B$, and $V_C$ of a voltage $V_{CGRV}$ that is applied to the selected word line, and the sequence to be applied are different.

Meanwhile, in the example described above, in the stages of each state, the flash memory determines whether the memory cell is in an ON state or an OFF state (a potential state of the bit line BL) by performing the sensing operation once. However, there is a possibility that, when the current $I_{total}$ is increased, the threshold voltage distribution of the memory cells becomes wider due to the floating of the source line SL. For this reason, there is a possibility that the flash memory cannot correctly determine ON and OFF states of the memory cell by performing the sense operation once, during each stage. Hence, the flash memory may perform the sensing operation two times during each stage.

(d) Modification Example

In the flash memory according to the present embodiment, the source line control circuit 14 may provide a correction voltage during the sensing period, using the capacitor C1.

Figure 12:
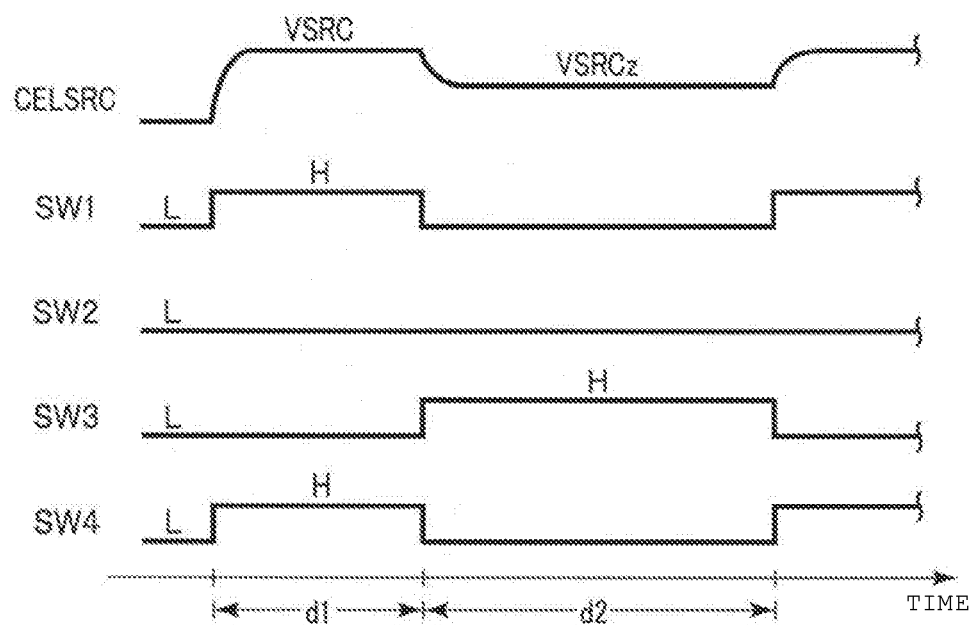
FIG. 12 is a timing diagram illustrating an operation example of the source line control circuit of the semiconductor memory according to the first embodiment.

As illustrated in FIG. 12, the source line control circuit 14 supplies the voltage VSRC to the input terminal IT1 of the amplifier A1, in response to the control signal SW1 of an H level, during the monitoring period d1, in the same manner as in the operation example of the source line control circuit 14 illustrated in FIG. 10. The amplifier A1 outputs a result in which the potential of the source line SL and the voltage VSRC are compared to each other, from the output terminal OT. The respective transistors T1, T3, and T5 operate in the manner described above.

In addition, the source line control circuit 14 sets the control signal SW4 to an H level, during the monitoring period d1. According to this, the transistor T9 is turned on, and the capacitor C1 is connected to the replica circuit 142.

The correction voltage VSRCz according to a drive state (magnitude of the current $I_{total}$) of the transistor T5 is applied to the capacitor C1 via the transistor T9 in an ON state. According to this, the capacitor C1 is charged.

The source line control circuit 14 then transitions a signal level of the control signal SW4 to an L level from an H level, at a timing in which a signal level of the control signal SW1 is set to an L level. With the transistor T9 in an OFF state, a voltage that is applied to the capacitor C1 from the replica circuit 142 becomes blocked.

The source line control circuit 14 transitions a signal level of the control signal SW3 to an H level from an L level, in synchronization with a timing in which the control signal SW4 is set as an L level. As a result, the transistor T8 is turned on, and the capacitor C1 is connected to the amplifier A1.

A potential corresponding to charges accumulated in the capacitor C1 is supplied to the terminal IT2 of the amplifier A1, as a voltage value (source line voltage) during the sensing period d2. The potential of the capacitor C1 corresponds to the correction voltage VSRCz during the monitoring period d1.

In a state in which the capacitor C1 is connected to the amplifier A1, a potential state of the bit line BL is sensed. Thereafter, the source line control circuit 14 transitions a signal level of the control signal SW3 from an H level to an L level. As a result, the capacitor C1 is electrically disconnected from the amplifier A1.

In this way, the control of the source line voltage is completed during the determination period of the threshold voltage of the memory cell MC with regard to a certain state.

As described in the present modification example, when the correction voltage VSRCz is supplied by the potential of the capacitor C1, the flash memory 201 according to the present embodiment may electrically disconnect the replica circuit 142 from the amplifier A1. As the result, the flash memory 201 according to the present embodiment may deactivate the replica circuit 142, and may reduce power consumption caused by the replica circuit 142.

(e) Summary

The flash memory according to the present embodiment monitors a total (current flowing through the source line) of the cell currents, in the inside of the chip, at the time of determining the threshold voltage of the memory cell.

The flash memory according to the present embodiment feeds back this monitoring result to control the potential of the source line.

According to this, the flash memory according to the present embodiment compensates for the floating of the source line caused by the cell current.

AS the result, the flash memory according to the present embodiment may suppress data pattern dependency (i.e., threshold voltage dependency) of the memory cell on the gate-source voltage and the drain-source voltage of the memory cell.

Thus, the flash memory according to the present embodiment may suppress broadening of the threshold voltage distribution of the memory caused by the noise of the source line, and may improve characteristics of the memory cell.

In addition, the flash memory according to the present embodiment may suppress an increase in a chip size caused by an increase in the number of source line contacts.

Furthermore, as described in the present embodiment, when the voltage (a source voltage of the memory cell) of the source line SL is suppressed, both of the gate-source voltage Vgs and the drain-source voltage Vds are simultaneously adjusted. Furthermore, an RC time constant of the source line is lower than RC time constants of the word line and the bit line. Hence, the flash memory according to the present embodiment may reduce the period for correcting the gate-source voltage Vgs and the drain-source voltage Vds of the flash memory.

As a result, the flash memory according to the present embodiment may suppress a delay in the operation thereof, and may improve reliability of the operation thereof.

As described above, the flash memory according to the present embodiment may improve operating characteristics thereof.

(2) Second Embodiment

A semiconductor memory device according to the second embodiment will be described with reference to FIG. 13.

In the flash memory according to the present embodiment, the source line control circuit 14 may control a voltage that is applied to the source line, using a digital value of a voltage value based on the monitoring results of the current flowing through the source line.

Figure 13:
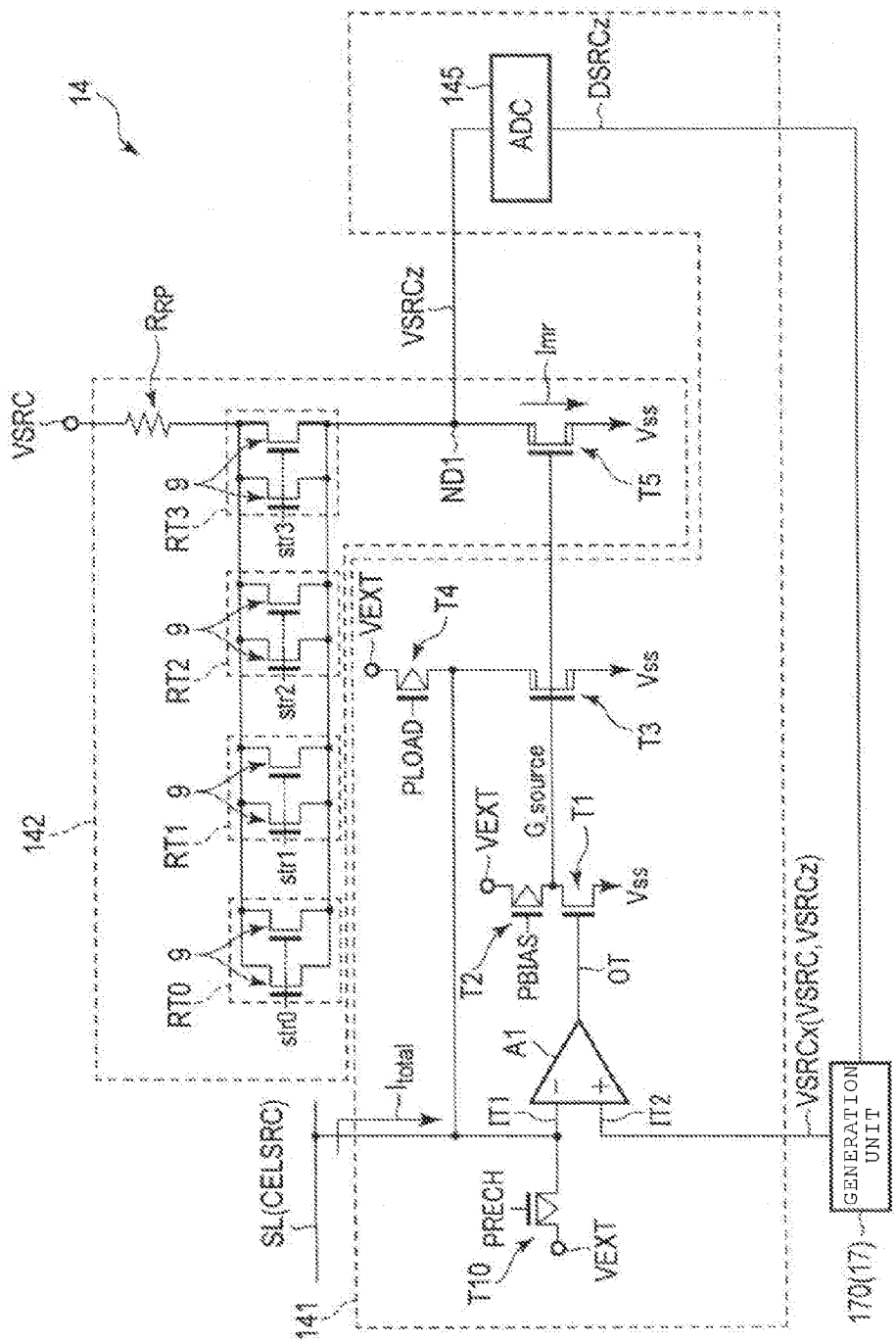
FIG. 13 is a diagram illustrating a configuration example of a source line control circuit of a semiconductor memory according to a second embodiment.

As illustrated in FIG. 13, the source line control circuit 14 includes an analog-digital conversion circuit (ADC circuit) 145.

The ADC circuit 145 converts the correction voltage VSRCz to a digital value from an analog value. The ADC circuit 145 feeds back the digital voltage value DVSRCz to the voltage generation circuit 17 as a digital value for controlling a reference voltage value of the amplifier A1.

A generation unit 170 of the voltage generation circuit 17 generates a reference voltage value (voltage that is applied to the source line) VSRCx of the amplifier A1.

The generation unit 170 supplies the voltage VSRC to the regulator circuit 141, during the monitoring period d1.

The generation unit 170 changes a magnitude of an output voltage VSRCx, based on the digital value DVSRCz. The generation unit 170 supplies the voltage VSRCz that is modulated based on the digital value to the regulator circuit 141.

The regulator circuit 141 controls a magnitude of the source line voltage CELSRC, using the reference voltage VSRCz, in such a manner that the voltage VSRCz which is controlled based on the digital value DVSRCz is applied to the source line CELSRC.

In this way, in the present embodiment, the source line control circuit 14 performs substantially the same operation as the operation described in the first embodiment, using the correction voltage VSRCz that is adjusted by a digital value.

As described above, even when the voltage that is used for the source line control circuit 14 is controlled with using the digital value, the flash memory according to the present embodiment obtains the same effect as the flash memory according to the first embodiment.

(3) Third Embodiment

A semiconductor memory device according to a third embodiment will be described with reference to FIG. 14.

The flash memory according to the third embodiment is different from the flash memories according to the first and second embodiments in a method of controlling the potential of the bit line, at the time of determining the threshold voltage of the memory cell.

In the flash memory according to the present embodiment, during the second processing for the bit line, the sense amplifier circuit (sense unit) continuously charges the bit line BL, regardless of the determination result (ON or OFF state of the memory cell) of the threshold voltage of the memory cell.

That is, the second processing is a control method of the bit line in which the lock out processing is not performed.

In the following description, the second processing in which the lock out processing is not performed is referred to as no lock out processing.

When the flash memory according to the present embodiment performs a verification step (or data reading) using no lock out processing, the sense amplifier circuit 13 charges not only the bit line BL connected to the target memory cell for verification, but also the bit line BL connected to the memory cell in an OFF state, at the time of verification of a certain state.

The flash memory according to the present embodiment performs determination (verification or data reading) of the threshold voltage of the memory cell, as described below.

Figure 14:
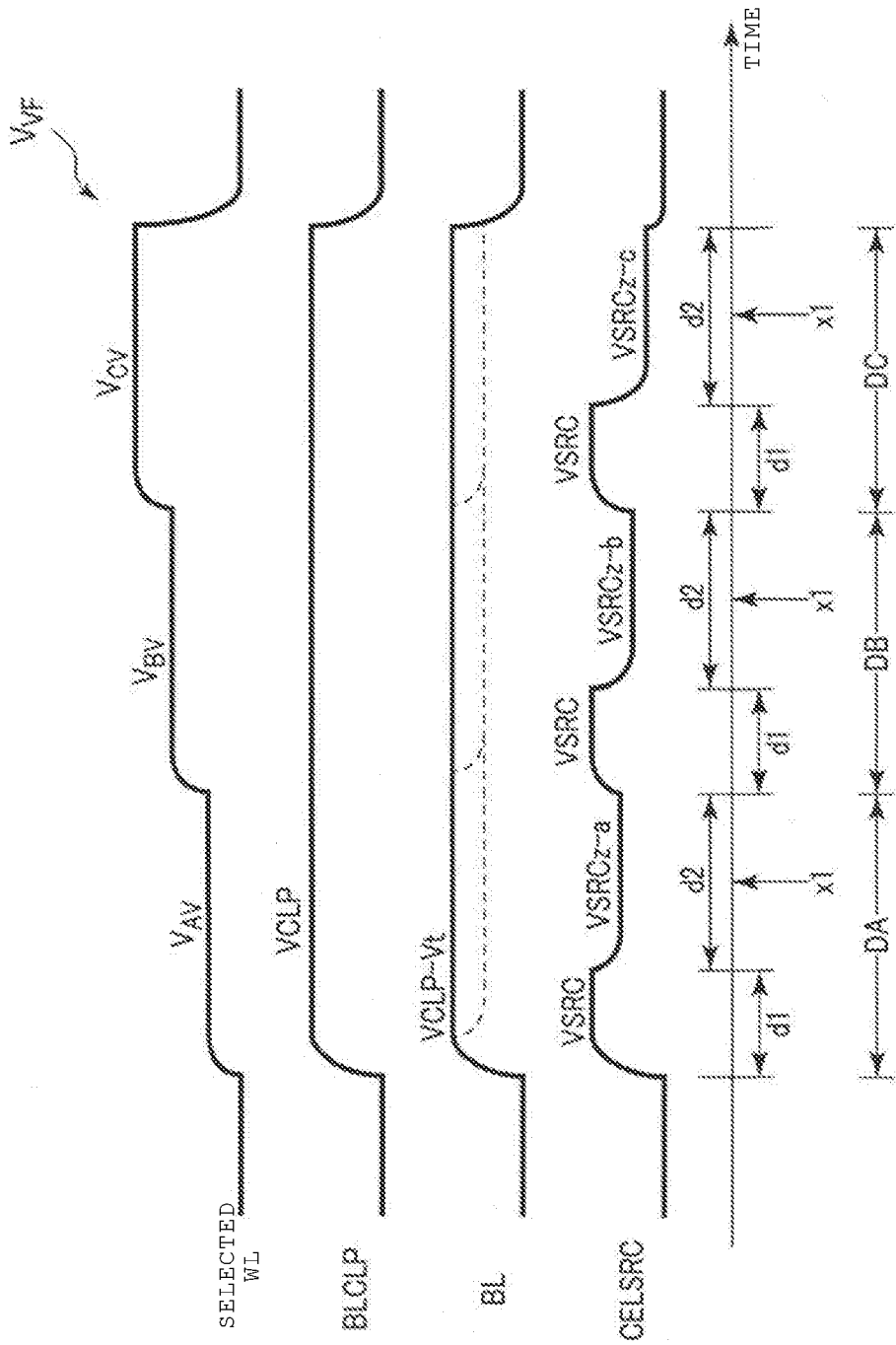
FIG. 14 is a timing diagram illustrating an operation example of a semiconductor memory according to a third embodiment.

As illustrated in a figure illustrating an operation of the flash memory in FIG. 14, the flash memory according to the present embodiment controls a potential of a wire in the memory cell array, in the same manner as the operation illustrated in FIG. 9, for example, at the time of verification step.

For example, during the monitoring period d1 of the verification stage of the A state, the source line control circuit 14 monitors the current $I_{total}$ using the voltage Vsrc as a reference voltage.

During the sensing period d2, the source line control circuit 14 senses the potential of the bit line BL, in a state in which the potential of the source line SL is controlled using the correction voltage VSRCz based on the monitoring results as a reference.

When verification is transitioned from the A state to the B state, the sense amplifier circuit 13 charges not only the bit line BL connected to the memory cell in an ON state, but also the bit line BL connected to the memory cell in an OFF state, regardless of the verification results of the memory cell with regard to the A state. In the B state, various processing are performed during the monitoring period and the sensing period, in a state in which all the bit lines BL are charged.

Even when verification is transitioned from the B state to the C state, the lock out processing is not performed, and the sense amplifier circuit 13 charges all the bit lines BL in the selected string unit.

In this way, the flash memory according to the present embodiment continuously charges all the bit lines BL connected to the memory cells that are verification targets, during the verification step.

Hence, in the flash memory in which no lock out processing is performed in the same manner as in the present embodiment, reduction of the cell current $I_{cell}$ caused by the bit line BL that is set to a non-select state, does not occur.

In the flash memory of no lock out processing, as the verification level becomes higher, the number of memory cells to be turned on is increased. As the result, as the verification step is being carried out, the number of NAND strings in which the cell current $I_{cell}$ is generated is increased.

As the result, the flash memory to which the no lock out processing is applied has a tendency in which an amount of currents flowing through the source line SL is increased in an order of the A state, the B state, and the C state. Hence, there is a probability that the floating amount of the potential of the source line which is generated by the current $I_{total}$ is increased together with rising of the verification level.

The source current $I_{total}$ in the verification stage DC of the C state is more than the current $I_{total}$ in the verification stage DA of the A state. For this reason, the correction voltage VSRCx-c in the verification stage DC of the C state offsets an increased amount of the potential that is generated by the current $I_{total}$, and thus, the correction voltage VSRCx-c in the verification stage DC of the C state becomes lower than the correction voltage VSRCx-a in the verification stage DA of the A state.

The correction voltage VSRCx-b in the verification stage DB of the B state is, for example, equal to or higher than the voltage VSRCx-a, and equal to or lower than the voltage VSRCx-c.

No lock out processing is applied to the flash memory according to the present embodiment, and thus the flash memory may speed up the determination processing of the threshold voltage of the memory cell MC.

The flash memory according to the present embodiment easily performs the no lock out processing that is generated by the relatively high current $I_{total}$, because the source line voltage is controlled based on the monitoring results of the current $I_{total}$ flowing through the source line.

As described above, the flash memory according to the third embodiment obtains the same effect as the flash memory according to the first and second embodiments.

(4) Fourth Embodiment

A semiconductor memory device according to a fourth embodiment will be described with reference to FIG. 15.

The flash memory according to the fourth embodiment is different from the flash memories according to the first to third embodiments in that the no lock out processing and the lock out processing exist together at the time of determining the threshold voltage of the memory cell.

For example, the flash memory 201 performs a writing sequence (writing loop) which uses a first program format.

A first program format is an operation of determining the threshold voltage of the memory cell MC, using two verification levels, with regard to the program verification of a certain state.

Hereinafter, the first program format is referred to as quick pass write (QPW).

The flash memory to which the QPW format is applied sets determination levels $V_{AVL}$ and $V_{BVL}$ for QPW, in addition to the target determination levels $V_{AV}$ and $V_{BV}$, in the A and B states. Hereinafter, the determination levels $V_{AV}$, $V_{BV}$ and $V_{CV}$ are referred to as target levels, and the determination levels for QPW $V_{AVL}$ and $V_{BVL}$ are referred to as QPW levels.

In the A and B state, the QPW levels $V_{AVL}$ and $V_{BVL}$ are lower than the target levels $V_{AV}$ and $V_{BV}$, and are higher than the reading levels $V_A$ and $V_B$.

Figure 15:
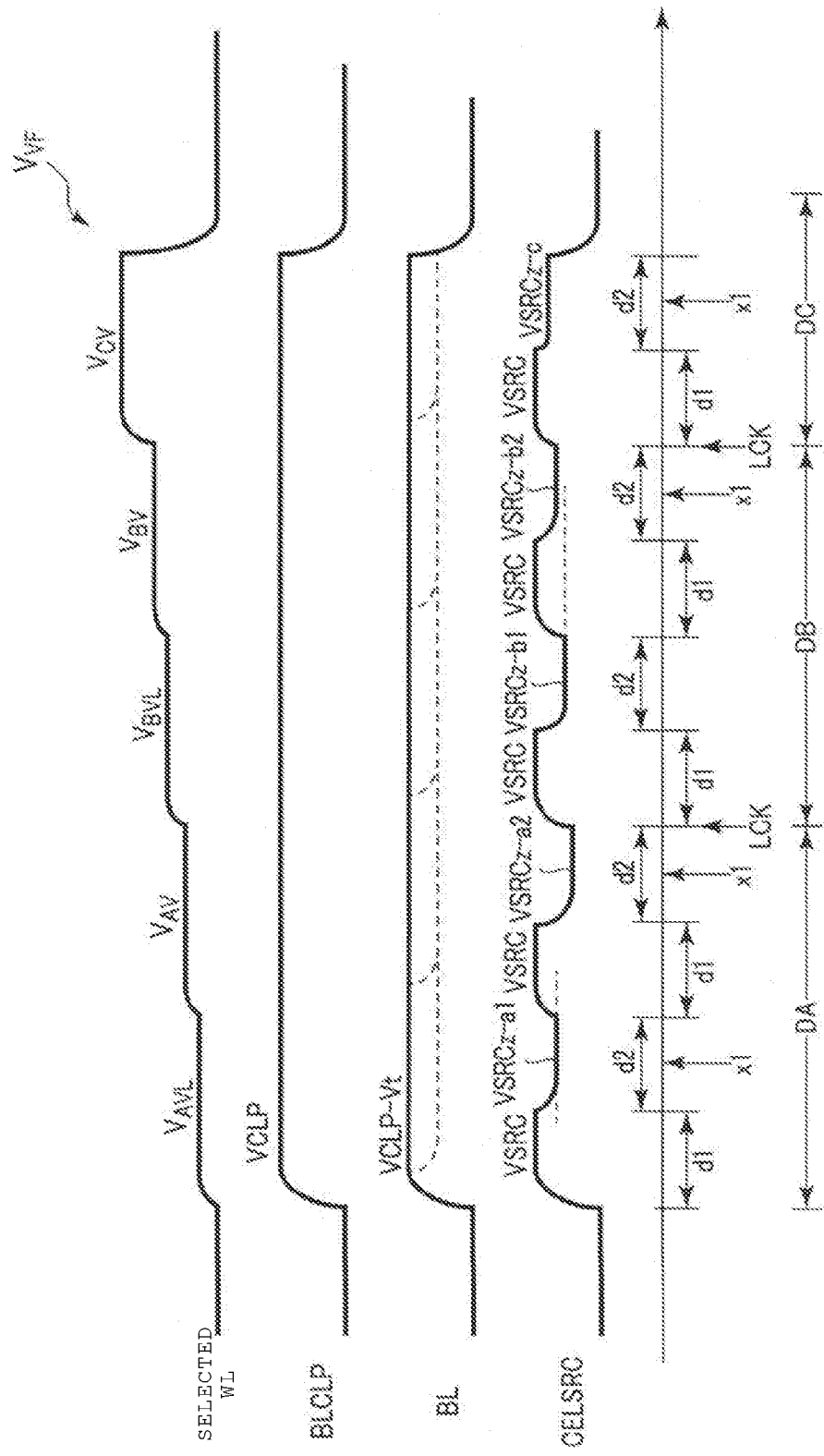
FIG. 15 is a timing diagram illustrating an operation example of a semiconductor memory according to a fourth embodiment.

As illustrated in a timing chart (figure illustrating changes of potentials of each wire) of FIG. 15, in the verification stage DA of the A state, after the monitoring period and the sensing period in the verification using the QPW level $V_{AVL}$, the flash memory 201 changes the verification level to the target level $V_{AV}$ from the QPW level $V_{AVL}$. In this case, the flash memory 201 control the potential of the bit line BL, using the no lock out processing.

In a state in which all the bit lines BL are charged, verification using the target level $V_{AV}$ is performed.

According to this, verification results of the QPW level and verification results of the target level are obtained with regard to the A state.

Even in the verification stage DB of the B state, the flash memory 201 controls the potential of the bit line BL, in the no lock out processing, when the verification level is transitioned from the QPW level $V_{BVL}$ to the target level $V_{AV}$.

In the flash memory according to the present embodiment, when the verification stage is transitioned from the A state to the B state, and when the verification stage is transitioned from the B state to the C state, the flash memory 201 performs the no lock out processing LCK. According to this, the sense amplifier circuit 13 sets the bit line connected to the memory cell of passed verification with regard to a certain state to a discharged state.

In the same manner as in the present embodiment, when presence and absence of the lock out processing exist together at the time of verification, a voltage value at the time of sensing of each state has the following values.

In the verification stage DA of the A state, during the no lock out processing, when the verification level is transitioned from the QPW level to the target level, a cell current amount that is supplied to the source line at the time of verification level $V_{AV}$ ($>V_{AVL}$) is more than a cell current amount that is supplied to the source line at the time of QPW level.

For this reason, a correction voltage VSRCz-a2 of the source line voltage CELSRC in the target level $V_{AV}$ is equal to or lower than the correction voltage VSRCz-a1 of the source line voltage CELSRC in the QPW level $V_{AVL}$.

In the same reason as at the time of verification of the A state, in the verification stage DB of the B state, a correction voltage VSRCz-b2 of the source line voltage CELSRC in the target level $V_{BV}$ is equal to or lower than the correction voltage VSRCz-b2 of the source line voltage CELSRC in the QPW level $V_{BVL}$.

When the verification stage is transitioned from the A state to the B state, the lock out processing is performed, and thus the current amount of the current $I_{total}$ flowing through the source line is reduced. As the result, the floating of the potential of the source line is relaxed, and thus a correction voltage VSRCz-b1 in the QPW level $V_{BVL}$ of the B state is higher than the correction voltage VSRCz-a2 in the target level $V_{AV}$ of the A state.

For the same reason as above, when the verification stage is transitioned from the B state to the C state, the lock out processing is performed, a correction voltage VSRCz-c of the C state is higher than the correction voltage VSRCz-b2 in the target level $V_{BV}$ Of the B state.

As described in the present embodiment, even when the threshold voltage of the memory cell is determined in such a manner that presence and absence of the lock out processing exist together, the source line control circuit 14 controls the voltage of the source line SL, based on the monitoring results of the current $I_{total}$ flowing through the source line.

Thus, the flash memory according to the present embodiment may obtain the same effect as the first to third embodiments.

(5) Fifth Embodiment

A semiconductor memory device according to a fifth embodiment will be described with reference to FIG. 16 and FIG. 17.

In the flash memory according to the fifth embodiment, a source line control circuit monitors a voltage (drive voltage) VHSA that is applied to a sense amplifier circuit. The source line control circuit controls a potential of the source line SL, based on monitoring results of the voltage VHSA on the sense amplifier circuit side.

Figure 16:
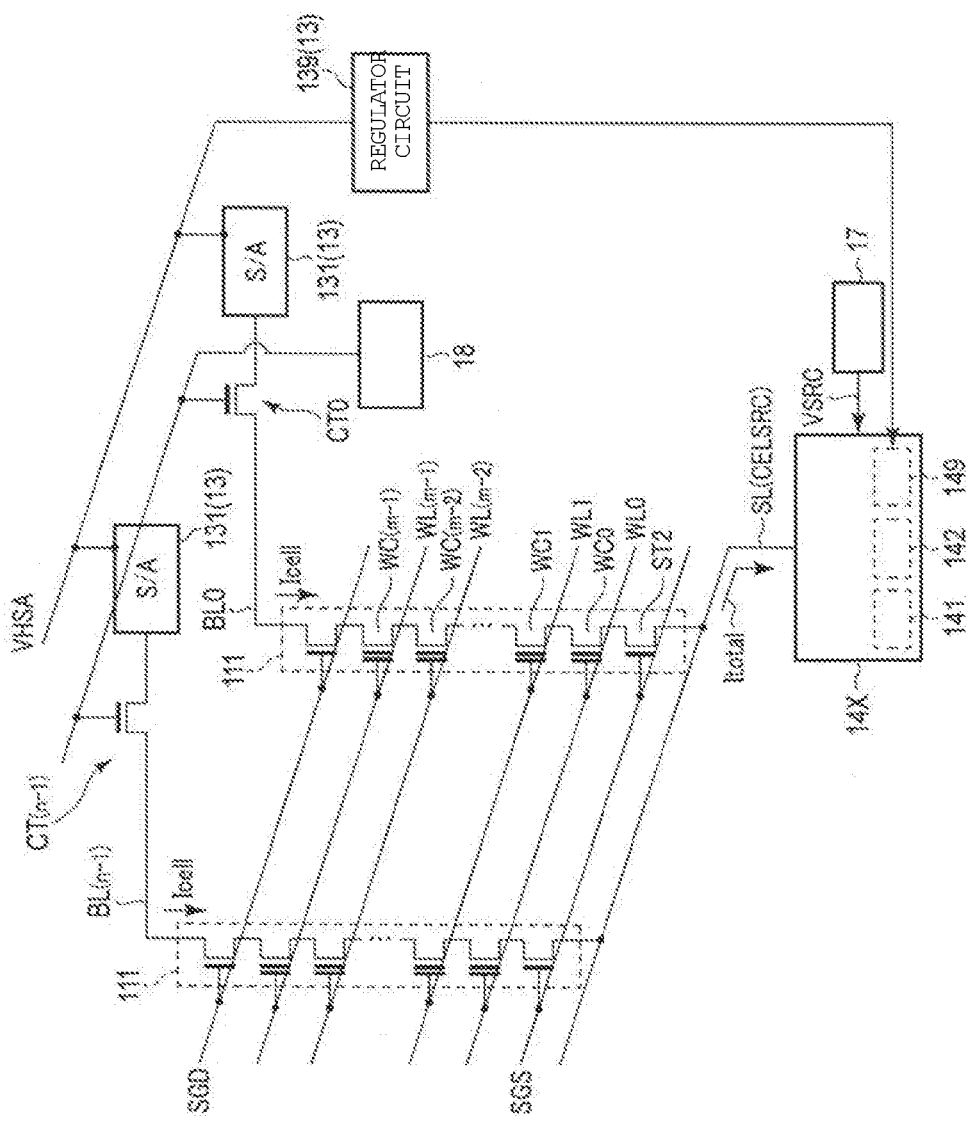
FIG. 16 is a diagram illustrating a configuration example of a semiconductor memory according to a fifth embodiment.

As illustrated in FIG. 16, a sense amplifier circuit 13 includes a regulator circuit 139. The regulator circuit 139 controls a magnitude of the voltage VHSA.

In the flash memory according to the present embodiment, a source line control circuit 14X includes a circuit (hereinafter referred to as a monitoring circuit) 149 for monitoring the drive voltage VHSA of the sense amplifier circuit 13 (sense unit 131). The monitoring circuit 149 may be a configurable element of the sense amplifier circuit 13.

Figure 17:
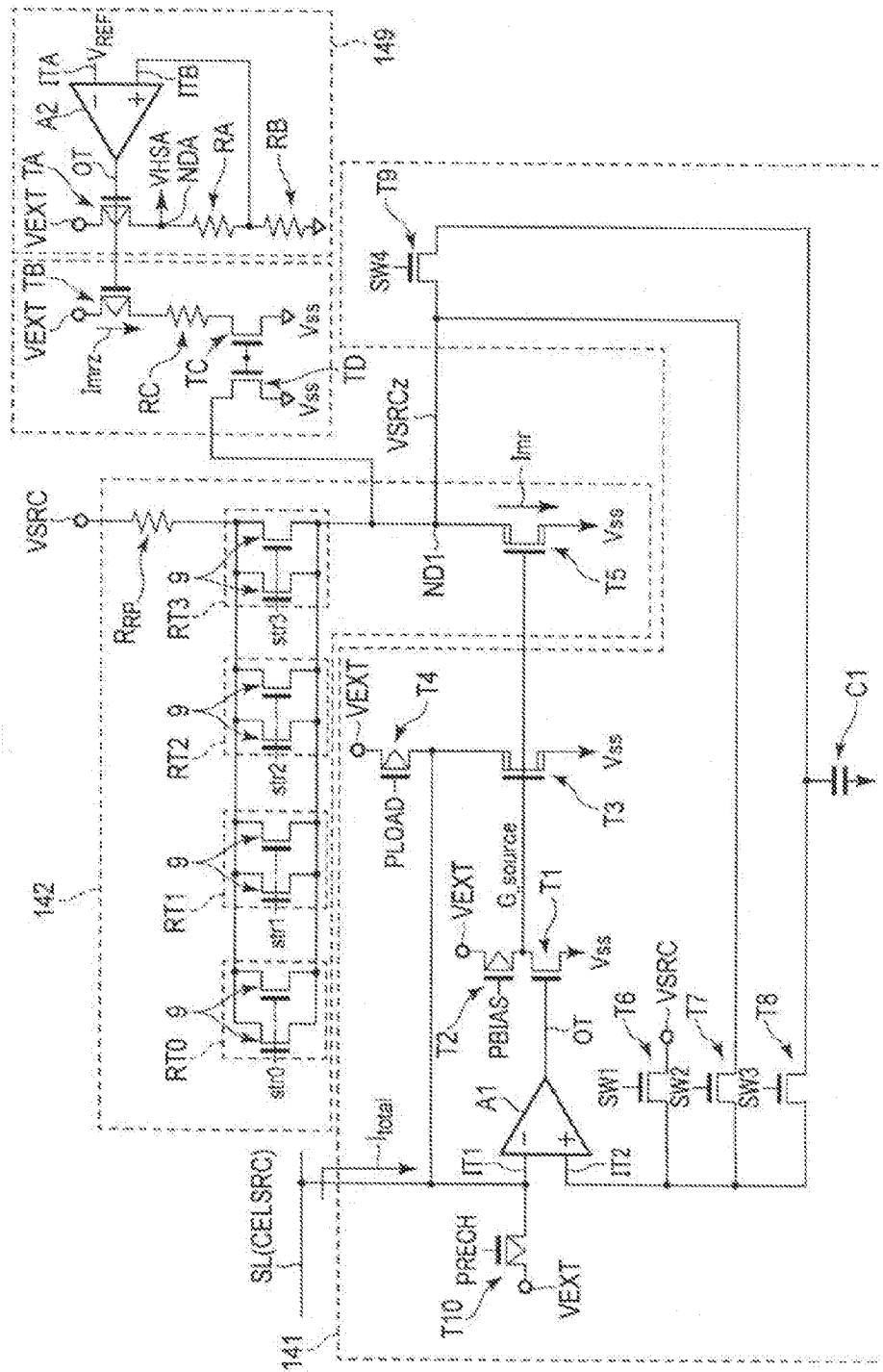
FIG. 17 is a diagram illustrating a configuration example of a semiconductor memory source line control circuit according to the fifth embodiment.

As illustrated in FIG. 17, the regulator circuit 139 includes an amplifier (for example, a differential amplifier) A2, a plurality of transistors TA to TD, and a plurality of resistor elements RA to RC.

The reference voltage VREF is supplied to an input terminal (for example, inverting input terminal) ITA of the amplifier A2. A junction of two resistor elements RA and RB is connected to an input terminal (for example, a non-inverting input terminal) ITB of the amplifier A2. An output terminal OT of the amplifier A2 is connected to a gate of the transistor (p type transistor) TA.

One terminal of the transistor TA is connected to a voltage terminal VEXT. The other terminal of the transistor TA is connected to an output node NDA. The voltage VHSA is output from the output node NDA to a sense unit 131. The other terminal of the transistor TA is connected to a ground terminal VSS via the two resistor elements RA and RB.

The resistor elements RA and RB function as a monitoring unit with respect to the voltage VHSA.

The transistor TA operates in response to an output from the amplifier A2. According to this, a magnitude of the voltage VHSA is adjusted so as to be constant.

The monitoring circuit 149 includes a plurality of transistors TB, TC, and TD, and a resistor RC.

A gate of the transistor (p type transistor) TB is connected to an output terminal OTA of the amplifier A2. One terminal of the transistor TB is connected to the voltage terminal VEXT (VCC). The other terminal of the transistor TB is connected to one terminal of the transistor TC via the resistor RC.

One terminal of the transistor TC is connected to a gate of the transistor TA. The other terminal of the transistor TC is connected to the ground terminal VSS. A gate of the transistor TC is connected to a gate of the transistor TD.

One terminal of the transistor TD is connected to one terminal (an output node of the regulator circuit 142) of a transistor T5. The other terminal of the transistor TD is connected to the ground terminal VSS.

The transistor TB makes a mirror current Imrz corresponding to a drain current of the transistor TA. For example, a gate size of the transistor TB is smaller than a gate size of the transistor TA. Hence, the mirror current Imrz of the transistor TB is smaller than the drain current of the transistor TA, in proportion to the gate sizes of the two transistors TA and TB.

The transistors TC and TD operate according to a voltage that is generated by a magnitude of the mirror current Imrz and the resistor element RC. A magnitude of an output VSRCz of the replica circuit 142 is changed depending on drain currents of the transistors TC and TD.

For example, when much mirror current Imrz flows through the resistor element RC, gate voltages of the transistors TC and TD increase. Hence, the transistors TC and TD strongly pull currents, and thereby a current flowing through the replica elements $R_{RP}$ and RT increases. According to this, an amount of current drop of the replica elements $R_{RP}$ and RT is increased, and the correction voltage (potential of the node ND1) VSRCz decreases.

In contrast to this, when small mirror current Imrz flows through the resistor element RC, the transistors TC and TD weakly pull the currents. In this case, an amount of current drop of the replica elements $R_{RP}$ and RT is decreased. Hence the correction voltage VSRCz in a case in which the mirror current Imrz is small is higher than the correction voltage VSRCz in a case in which the mirror current Imrz is much.

Meanwhile, when the voltage VHSA is equal to or lower than the reference voltage VERF, the drain currents (mirror current) of the transistors TA and TB increase. When the voltage VHSA is higher than the reference voltage VERF, the drain currents of the transistors TA and TB decrease.

Adjustment of the output of the replica circuit according to an increase or a decrease of the mirror current Imrz, is repeatedly performed during the monitoring period.

As described above, in the flash memory 201 according to the present embodiment, a change amount of the drive voltage VHSA, in addition to an amount of drop of the voltage that is generated by a parasitic resistance in the memory cell array according to the replica circuit 142, is reflected in the control of the voltage of the source line.

According to this, the flash memory according to the present embodiment may control the potential of the source line, with a higher accuracy.

Meanwhile, since description on the entire operations of the source line control circuit according to the present embodiment is substantially the same as the description in the first to fourth embodiments, the description thereof will be omitted herein.

As described above, the semiconductor memory device according to the fifth embodiment obtains the same effect as the first to fourth embodiments.

(6) Others

A read operation of a multi-value flash memory includes the following determination voltage.

A determination voltage that is applied to a word line selected in a read operation of an A level is, for example, a voltage between 0 V and 0.55 V. However, the determination voltage of the A level is not limited to this, and may be in any one of ranges between 0.1 V and 0.24 V, between 0.21 V and 0.31 V, between 0.31 V and 0.4 V, between 0.4 V and 0.5 V, and between 0.5 V and 0.55 V.

A determination voltage that is applied to a word line selected in a read operation of a B level is, for example, a voltage between 1.5 V and 2.3 V. However, the determination voltage of the B level is not limited to this, and may be in any one of ranges between 1.65 V and 1.8 V, between 1.8 V and 1.95 V, between 1.95 V and 2.1 V, and between 2.1 V and 2.3 V.

A determination voltage that is applied to a word line selected in a read operation of a C level is, for example, a voltage between 3.0 V and 4.0 V. However, the determination voltage of the C level is not limited to this, and may be in any one of ranges between 3.0 V and 3.2 V, between 3.2 V and 3.4 V, between 3.4 V and 3.5 V, between 3.5 V and 3.6 V, and between 3.6 V and 4.0 V.

Meanwhile, a period (tR) of a read operation may be any one of periods, for example, 25 µs to 38 µs, 38 µs to 70 µs, and 70 µs to 80 µs.

A write operation of a multi-value flash memory includes a program operation and a verification operation.

In the write operation of the multi-value flash memory, a voltage that is firstly applied to a word line selected at the time of the program operation is, for example, a voltage between 13.7 V and 14.3 V. The voltage is not limited to this value, and may be one of voltages in ranges, for example, between 13.7 V and 14.0 V, and between 14.0 V and 14.6 V.

A voltage that is firstly applied to a word line selected when a write operation with respect to the memory cell of an odd-numbered word line is performed may be different from a voltage that is first applied to a word line selected when the write operation with respect to the memory cell of an even-numbered word line is performed.

When the program operation is an incremental step pulse program (ISPP) method, a step-up voltage is, for example, approximately 0.5 V.

A non-select voltage (pass voltage) that is applied to a non-selected word line is, for example, a value in a range between 6.0 V and 7.3 V. However, the non-select voltage is not limited to this value, may be a value in a range, for example, between 7.3 V and 8.4 V, and may be a value equal to or lower than 6.0 V.

A pass voltage to be applied may be changed depending on whether the non-selected word line is an odd-numbered word line or an even-numbered word line.

The time (tProg) of the write operation may be any one of periods, for example, 1,700 µs to 1,800 µs, 1,800 µs to 1,900 µs, and 1,900 µs to 2,000 µs.

An erase operation of the multi-value flash memory is formed on an upper portion of the semiconductor substrate, and a voltage that is firstly applied to the well region over which the memory cell is arranged is, for example, a value in a range between 12 V and 13.6 V. The voltage is not limited to this value, and may be in anyone of the values in ranges, for example, between 13.6 V and 14.8 V, between 14.8 V and 19.0 V, between 19.0 V and 19.8 V, and between 19.8 V and 21 V.

The time of the erase operation (+Erase) may be any one of periods, for example, 3,000 µs to 4,000 µs, 4,000 µs to 5,000 µs, and 5,000 µs to 9,000 µs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a plurality of memory cells that are stacked above a substrate;
a plurality of word lines that are electrically connected to gates of the memory cells;
a source line that is electrically connected to one end of the memory cells; and
a controller configured to execute a read operation that includes a first operation carried out over first and second time periods and a second operation carried out over third and fourth time periods, a first voltage being applied to a selected word line during the first and second time periods of the first operation, a second voltage that is higher than the first voltage being applied to the selected word line during the third and fourth time periods of the second operation, a third voltage being applied to the source line during the first and third time periods, a fourth voltage that is lower than the third voltage being applied to the source line during the second time period, and a fifth voltage that is lower than the third voltage being applied to the source line during the fourth time period.
2. The device according to claim 1, wherein the fourth voltage is lower than the fifth voltage.
3. The device according to claim 1, wherein the fourth voltage is higher than the fifth voltage.

4. The device according to claim 1, further comprising:
a row decoder configured to control voltages applied to the selected word line; and
a source line control circuit configured to control voltages applied to the source line.

5. The device according to claim 4, wherein the source line control circuit includes:
a voltage control circuit including an amplifier having a first input electrically connected to the source line and a second input electrically connected to first and second transistors; and
a replica circuit configured to generate a replica voltage representative of an actual voltage level of the source line, at an output node thereof, wherein
the first transistor is between a voltage source of the third voltage and the second input, and the second transistor is between the output node of the replica circuit and the second input, and
the first transistor is turned on and the second transistor is turned off during the first and third time periods, and the second transistor is turned on and the first transistor is turned off during the second and fourth time periods.

6. The device according to claim 5, wherein replica circuit includes:
a first replica transistor having a first resistance electrically connected between the voltage source of the third voltage and the output node of the replica circuit; and
a second replica transistor having a second resistance different from the first resistance electrically connected in parallel to the first replica transistor, between the voltage source of the third voltage and the output node of the replica circuit, wherein
the first replica transistor is turned on and the second replica transistor is turned off during the second time period, and the second replica transistor is turned on and the first replica transistor is turned off during the fourth time period.

7. The device according to claim 5, wherein the voltage control circuit includes:
a third transistor between the second transistor and the output node of the replica circuit; and
a capacitor between the second and third transistors, wherein
the first and third transistors are turned on and the second transistor is turned off during the first and third time periods, and the second transistor is turned on and the first and third transistors are turned off during the second and fourth time periods.

8. The device according to claim 4, wherein the source line control circuit includes:
a voltage control circuit including an amplifier having a first input electrically connected to the source line and a second input electrically connected to a voltage generating unit; and
a replica circuit configured to generate a replica voltage representative of an actual voltage level of the source line, at an output node thereof, wherein
the voltage generating unit supplies one of the third voltage and the fourth or fifth voltage to the second input of the amplifier.

9. The device according to claim 8, wherein the voltage generating unit generates the fourth or fifth voltage based on a digital value corresponding to the replica voltage.

10. The device according to claim 9, wherein replica circuit includes:
a first replica transistor having a first resistance electrically connected between the voltage source of the third voltage and the output node of the replica circuit; and
a second replica transistor having a second resistance different from the first resistance electrically connected in parallel to the first replica transistor, between the voltage source of the third voltage and the output node of the replica circuit, wherein
the first replica transistor is turned on and the second replica transistor is turned off during the second time period, and the second replica transistor is turned on and the first replica transistor is turned off during the fourth time period.

11. A method of executing a read operation that includes a first operation carried out over first and second time periods and a second operation carried out over third and fourth time periods, in a semiconductor memory device having a plurality of memory cells that are stacked on a substrate, a plurality of word lines that are electrically connected to gates of the memory cells, and a source line that is electrically connected to one end of the memory cells, said method comprising:
applying a first voltage to a selected word line during the first and second time periods of the first operation;
applying a second voltage to the selected word line that is higher than the first voltage during the third and fourth time periods of the second operation;
applying a third voltage to the source line during the first and third time periods;
applying a fourth voltage that is lower than the third voltage to the source line during the second time period; and
applying a fifth voltage that is lower than the third voltage to the source line during the fourth time period.

12. The method according to claim 11, wherein the fourth voltage is lower than the fifth voltage.

13. The method according to claim 11, wherein the fourth voltage is higher than the fifth voltage.

14. The method according to claim 11, wherein the semiconductor memory device includes:
a row decoder that controls voltages applied to the selected word line; and
a source line control circuit that controls voltages applied to the source line.

15. The method according to claim 14, wherein the source line control circuit includes:
a voltage control circuit including an amplifier having a first input electrically connected to the source line and a second input electrically connected to first and second transistors; and
a replica circuit that generates a replica voltage representative of an actual voltage level of the source line, at an output node thereof, wherein
the first transistor is between a voltage source of the third voltage and the second input, and the second transistor is between the output node of the replica circuit and the second input, and
the first transistor is turned on and the second transistor is turned off during the first and third time periods, and the second transistor is turned on and the first transistor is turned off during the second and fourth time periods.

16. The method according to claim 15, wherein replica circuit includes:
a first replica transistor having a first resistance electrically connected between the voltage source of the third voltage and the output node of the replica circuit; and a second replica transistor having a second resistance different from the first resistance electrically connected in parallel to the first replica transistor, between the voltage source of the third voltage and the output node of the replica circuit, wherein the first replica transistor is turned on and the second replica transistor is turned off during the second time period, and the second replica transistor is turned on and the first replica transistor is turned off during the fourth time period.

17. The method according to claim 15, wherein the voltage control circuit includes:

a third transistor between the second transistor and the output node of the replica circuit; and a capacitor between the second and third transistors, wherein the first and third transistors are turned on and the second transistor is turned off during the first and third time periods, and the second transistor is turned on and the first and third transistors are turned off during the second and fourth time periods.

18. The method according to claim 14, wherein the source line control circuit includes:

a voltage control circuit including an amplifier having a first input electrically connected to the source line and a second input electrically connected to a voltage generating unit; and a replica circuit configured to generate a replica voltage representative of an actual voltage level of the source line, at an output node thereof, wherein the voltage generating unit supplies one of the third voltage and the fourth or fifth voltage to the second input of the amplifier.

19. The method according to claim 18, wherein the voltage generating unit generates the fourth or fifth voltage based on a digital value corresponding to the replica voltage.

20. The method according to claim 19, wherein replica circuit includes:

a first replica transistor having a first resistance electrically connected between the voltage source of the third voltage and the output node of the replica circuit; and a second replica transistor having a second resistance different from the first resistance electrically connected in parallel to the first replica transistor, between the voltage source of the third voltage and the output node of the replica circuit, wherein the first replica transistor is turned on and the second replica transistor is turned off during the second time period, and the second replica transistor is turned on and the first replica transistor is turned off during the fourth time period.

\* \* \* \* \*